(12) United States Patent
Kunori et al.

(10) Patent No.: US 7,282,764 B2
(45) Date of Patent: Oct. 16, 2007

(54) SEMICONDUCTOR DEVICE

(75) Inventors: Shinji Kunori, Saitama (JP); Hiroaki Shishido, Saitama (JP); Masato Mikawa, Saitama (JP); Kosuke Ohshima, Saitama (JP); Masahiro Kuriyama, Saitama (JP); Mizue Kitada, Saitama (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 11/481,247

(22) Filed: Jul. 6, 2006

(65) Prior Publication Data

US 2007/0045776 A1    Mar. 1, 2007

Related U.S. Application Data

(63) Continuation of application No. PCT/JP2004/018480, filed on Dec. 10, 2004.

(30) Foreign Application Priority Data

Jan. 7, 2004    (JP) ............................ 2004-001886

(51) Int. Cl.
    *H01L 29/76*    (2006.01)
(52) U.S. Cl. ...................... 257/339; 257/493
(58) Field of Classification Search ............... 257/339, 257/341, 492, 493
    See application file for complete search history.

(56) References Cited

U.S. PATENT DOCUMENTS

2007/0045776 A1*    3/2007    Kunori et al. ............... 257/592

FOREIGN PATENT DOCUMENTS

| JP | 62-169368 | 7/1987 |
| JP | 3-54868 | 3/1991 |
| JP | 3-155677 | 7/1991 |
| JP | 3-238871 | 10/1991 |
| JP | 7-221192 | 8/1995 |
| JP | 2000-77662 | 3/2000 |

* cited by examiner

*Primary Examiner*—Mark V. Prenty
(74) *Attorney, Agent, or Firm*—Kratz, Quintos & Hanson, LLP

(57) ABSTRACT

A semiconductor device having high ruggedness is provided. The distance $Wm_2$ between buried regions, positioned at the bottoms of different base diffusion regions and face each other, is set smaller than the distance $Wm_1$ between buried regions positioned at the bottom of the same base diffusion region ($Wm_1 > Wm_2$). An avalanche breakdown occurs under the bottom of the base diffusion region, and the avalanche current is not passed through a high resistance part immediately under the source diffusion region in the base diffusion region, thereby providing high withstand strength against destruction.

11 Claims, 20 Drawing Sheets

MOSFET (a) (b)

(a) (b)

(a) (b)

(a)

(b)

(a)

(b)

(a)

(b)

(a)  (b)

(a)  (b)

(a)  (b)

(a)          (b)

(a)          (b)

Schottky junction type IGBT

SEMICONDUCTOR DEVICE

This is a Continuation of International Application No. PCT/JP2004/018480 filed Dec. 10, 2004. The entire disclosure of the prior application is hereby incorporated by reference herein in its entirety.

BACKGROUND OF THE INVENTION

1. Field of the Invention

The present invention relates to a technique of increasing the breakdown voltage of a semiconductor device, and more particularly to a technique for increasing the breakdown voltage and improving withstand strength against destruction.

2. Discussion of the Relevant Art

In the technical field of power semiconductor devices, RESURF structure have been studied as promising means for obtaining increased breakdown voltage.

The reference numeral 101 in FIG. 37 denotes a conventional semiconductor device in which an N type resistance layer 112 having a large resistance value is epitaxially grown on an N-type substrate 111 having a small resistance value.

A plurality of long and narrow P-type base diffusion regions 117 are formed on the inner surface of the resistance layer 112. A long and narrow P-type Ohmic diffusion region 120 having a surface concentration higher than that of the base diffusion region 117 is provided in the width-wise center of the inner surface of each of the base diffusion regions 117.

A long and narrow N-type source diffusion region 121 is provided parallel to the Ohmic diffusion region 120 on both sides of the Ohmic diffusion region 120 and inner surface of the base diffusion region 117.

At the inner surface of the base diffusion region 117, the part between the outer periphery of the source diffusion region 121 and the outer periphery of the base diffusion region 117 forms a channel region 122, on which a gate insulating film 134 and a gate electrode film 136 are arranged in the above-mentioned order.

An interlayer insulating film 137 is provided on the gate electrode film 136, and a source electrode film 138 in contact with the source diffusion region 121 and the Ohmic diffusion region 120 is provided on the interlayer insulating film 137. The source electrode film 138 is isolated from the gate electrode film 136 by the interlayer insulating film 137.

Therefore, the source electrode film 138 is electrically connected to the source diffusion region 121, while the source electrode film is insulated from the gate electrode film 136. Furthermore, the source electrode film 138 is electrically connected to the base diffusion region 117 through the Ohmic diffusion region 120. A protection film 139 is formed on the surface of the source electrode film 138.

The drain electrode film 130 is formed on the back surface of the substrate 111. As the source electrode film 138 is grounded, a positive voltage is applied to the drain electrode film 130 and a voltage equal to or larger than the threshold voltage is applied to the gate electrode film 136 so that the channel region 122 has its polarity inverted to N-type. The inversion layer connects the source diffusion region 121 and the resistance layer 112. This state is a conduction state in which current is passed from the drain electrode film 130 to the source electrode film 138.

Once the gate electrode 136 attains a potential equal to that of the source electrode film 138, the inversion layer disappears. As a result, current no longer flows; i.e., a cutoff state is attained.

A P-type buried region 146 is provided in contact with the base diffusion region 117 at the bottom of the base diffusion region 117. In the cutoff state, a PN junction between the P-type region including the base diffusion region 117 and the buried region 146 and the N-type region including the resistance layer 112 is reversely biased so that depletion layers greatly expand both from the base diffusion region 117 and the buried region 146 toward both the P-type region and the N-type region.

The buried region 146 is a long and narrow region that extends in the lengthwise direction of the long and narrow base diffusion region 117. The buried region is provided in the center of width direction of each of the base diffusion regions 117.

The base diffusion regions 117 are provided parallel to one another and the buried regions 146 are positioned parallel to one another. Depletion layers extending laterally from the buried regions 146 are connected to adjacent buried regions 146 in the central position so that the resistance layer 112 between the buried regions 146 is filled with the depletion layers.

If the amount of the N-type impurity contained in the part of the resistance layer 112 between the buried regions 146 is set equal to the amount of the P-type impurity contained in the buried regions 146, then the buried regions 146 are also filled with the depletion layers when the part of the resistance layer 112 between the buried regions 146 is filled with the depletion layers.

In this state, the space from the bottom of the base diffusion region 117 to the lower end of the buried region 146 is filled with a depletion layer whose bottom is flat as if the depletion layer expands from a planar junction, and the breakdown voltage is advantageously increased. The diffusion structure in which the amounts of impurities allow such a depletion layer to form is called "RESURF structure."

When a large reverse biased voltage is applied to the semiconductor device having the above described RESURF structure, it cannot be ascertained whether avalanche breakdown occurs immediately below a base diffusion region 117 or in a lower position of the resistance layer 112 between base diffusion regions 117.

If avalanche breakdown occurs immediately below the base diffusion region 117, current is passed to the high resistance part of the base diffusion region 117 below the source diffusion region 121, and a parasitic bipolar transistor conducts, the high resistance part may be break down.

BACKGROUND OF THE INVENTION

It is an object of the invention to provide a semiconductor device having high breakdown voltage and high withstand strength against destruction.

It is an object of the invention to provide a semiconductor device having high breakdown voltage and high withstand strength against destruction.

In order to solve the above described object, a semiconductor device according to claim 1 includes a resistance layer of a first conductivity type, a plurality of base diffusion regions of a second conductivity type formed in the vicinity of inner surface of the resistance layer and positioned apart from one another, a source diffusion region of the first conductivity type formed in the vicinity of inner surface of each of the base diffusion regions in a region more on the inner side than the edge of each of the base diffusion regions and the source diffusion region has a depth shallower than that of each of the base diffusion regions, a channel region positioned near the edge of each of the base diffusion regions and between the edges of each of the base diffusion regions and edges of each of the source diffusion regions, a gate insulating film positioned at least on each of the channel regions, a gate electrode film positioned on the gate insulating film, and a plurality of buried regions of the second conductivity type provided plurally on the bottom of each of the base diffusion regions and connected to each of the base diffusion regions. Among pairs of adjacent base diffusion regions, between a center of width direction of one base diffusion region and the center of width direction of the other base diffusion region and in a range deeper than the depth of the base diffusion regions and shallower than the bottom of the buried regions, an amount of impurity of the first conductivity type and an amount of the impurity of the second conductivity type are nearly equal. Furthermore, a PN junction between the buried region and the resistance layer is set such that avalanche breakdown does not occur at a voltage at which the buried regions is filled with the depletion layer. Moreover, a width $Wm_1$ of the resistance layer in the part between the buried regions adjacent at the bottom of the same base diffusion region is larger than a width $Wm_2$ of the resistance layer in the part between the buried regions adjacent at the bottoms of the different base diffusion regions.

According to the invention as recited in claim 2, in the semiconductor device according to claim 1, the base diffusion regions have a longitudinal direction, the longitudinal directions are provided parallel to one another, and the buried regions are provided parallel to one another along the longitudinal directions of the base diffusion regions.

According to the invention as recited in claim 3, in the semiconductor device according to claim 1, each of the buried regions includes an active groove formed in the resistance layer and a semiconductor material of the second conductivity type filled in the active groove.

According to the invention as recited in claim 4, in the semiconductor device according to claim 2, widths of the buried regions are equal to each other.

According to the invention as recited in claim 5, in the semiconductor device according to claim 2, lengths of the buried regions are equal.

According to the invention as recited in claim 6, the semiconductor device according to claim 1 includes a plurality of ring-shaped withstand voltage grooves surrounding the base diffusion region and a semiconductor material of the second conductivity type provided in the withstand voltage grooves.

According to the invention as recited in claim 7, the semiconductor device according to claim 1 further includes a source electrode film electrically connected to the source diffusion region and the base diffusion region.

According to the invention as recited in claim 8, the semiconductor device according to claim 1 further includes a drain layer of the same conductivity type as that of the resistance layer and having a higher concentration than that of the resistance layer arranged on a surface opposite to the surface of the resistance layer at which the base diffusion region is formed.

According to the invention as recited in claim 9, the semiconductor device according to claim 1 further includes a collector layer of the conductivity type opposite to that of the resistance layer arranged on a surface opposite to the surface of the resistance layer at which the base diffusion region is formed.

According to the invention as recited in claim 10, the semiconductor device according to claim 1 further includes a Schottky electrode film that forms a Schottky junction with the resistance layer arranged on a surface opposite to the surface of the resistance layer at which the base diffusion region is formed.

According to the invention as recited in claim 11, the semiconductor device according to claim 7 further includes a drain electrode film formed on the surface of the resistance layer on a side having the base diffusion region, and the drain electrode film is electrically connected to the resistance layer and insulated from the source electrode film.

According to the invention as described above, the distance $Wm_1$ between adjacent buried regions among a plurality of buried regions positioned at the bottom of the same base diffusion region is the same as the width $Wm_1$ of the resistance layer between these buried regions. The distance $Wm_2$ between adjacent buried regions positioned at the bottoms of adjacent base diffusion regions can be equal to the width $Wm_2$ of the resistance layer between these buried regions. The distance $Wm_1$ is formed to be larger than the distance $Wm_2$, and avalanche breakdown occurs under the bottom of the part between the buried regions in the base diffusion region.

The source diffusion regions are provided at prescribed intervals along the edge of the base diffusion region, and the source electrode film connected to the source diffusion region is electrically connected to the base diffusion region about the center of a width direction of the base diffusion region.

Therefore, avalanche current generated by avalanche breakdown is not passed through the high resistance part in the base diffusion region under the bottom of the source diffusion region, and therefore high ruggedness can be obtained.

It is noted that when the base diffusion regions and the buried regions are formed in long and narrow shapes, the buried regions are provided parallel in the longitudinal direction of the base diffusion regions.

Accordingly, a semiconductor device with high withstand strength against destruction can be obtained.

DETAILED DESCRIPTION OF THE PREFERRED EMBODIMENTS

Figure 1:
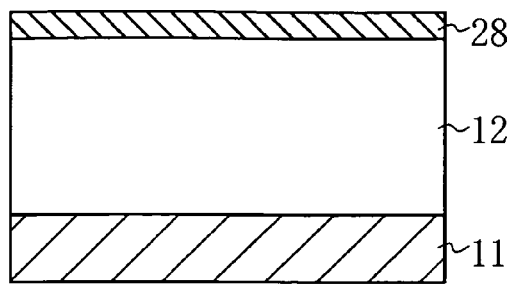
FIGS. 1(*a*) and 1(*b*) are views for illustrating a process of manufacturing a semiconductor device according to the invention (1)
Figure 1:
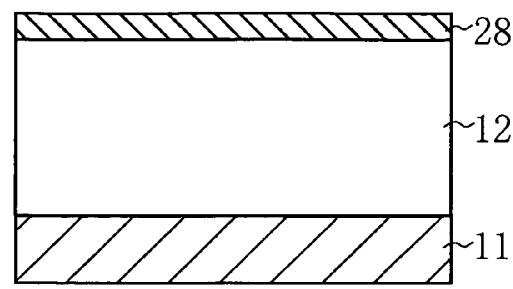

According to the invention, among P type and N type, one is referred to as the first conductivity type and the other as the second conductivity type. When the first conductivity type is N-type, the second conductivity is P-type; and conversely, when the first conductivity type is P-type, the second conductivity type is N-type.

In the following description of embodiments, the semiconductor substrate or the semiconductor layer is made of single crystal of silicon, while the material may be crystal of other semiconductor materials.

The structure of a semiconductor device according to the invention will be described. The reference numeral 1 in FIGS. 27 and 28 denotes a semiconductor device according to a first embodiment of the invention.

The semiconductor device 1 has a semiconductor support layer 11 of a first conductivity type. A plurality of such semiconductor devices 1 according to the invention are produced in a single wafer. A first conductivity type growth layer 12 is epitaxially grown on the surface of the semiconductor support layer 11 in the wafer state.

The internal structure of one semiconductor device is hereinafter described.

At the inner surface of the growth layer 12 and in the center of the semiconductor device 1, a conductive layer 14 of the first conductivity type having a concentration higher than that of the growth layer 12 is formed. The growth layer 12 and the conductive layer 14 form a resistance layer 15 that serves as the drain of a MOS transistor. Semiconductor devices without the conductive layer 14 are covered by the invention, and in such a case, the resistance layer 15 is formed by the growth layer 12.

A plurality of base diffusion regions 17a of the second conductivity type are formed at prescribed intervals in the vicinity of inner surface of the resistance layer 15. All the base diffusion regions 17a are equal in depth, and shallower than the depth of the conductive layer 14 in this example. However, semiconductor devices having a conductive layer 14 with a depth smaller than the base diffusion regions 17a are also covered by the invention.

In the vicinity of the inner surface of each of the base diffusion regions 17a, a source diffusion region 21 of the first conductivity type and an Ohmic diffusion region 20 of the second conductivity type having a surface concentration higher than that of the base diffusion region 17a are provided.

Each of the base diffusion region 17a, the source diffusion region 21, and the Ohmic diffusion region 20 has a long and narrow two-dimensional shape such as a rectangle; one or two source diffusion regions 21 are provided at inner surface of each base diffusion region 17a; and the longer side of the source diffusion region 21 is provided along the longitudinal direction of the base diffusion region 17a.

The Ohmic diffusion region 20 is provided in the center of width direction of each base diffusion region 17a and has its longer side provided along the longitudinal direction of the base diffusion region 17a.

The widths and lengths of the source diffusion region 21 and the Ohmic diffusion region 20 are smaller than those of the base diffusion region 17a; and the depth of the source diffusion region 21 and the Ohmic diffusion region 20 are shallower than that of the base diffusion region 17a. The source diffusion region 21 and the Ohmic diffusion region 20 are provided so that they do not extend from the base diffusion region 17a.

The source diffusion region 21 and the base diffusion region 17a are of the opposite conductivity types, and therefore a PN junction forms between the source diffusion region 21 and the base diffusion region 17a. Meanwhile, the Ohmic diffusion region 20 and the base diffusion region 17a are of the same conductivity type and therefore electrically connected with each other.

The source diffusion region 21 is provided with a predetermined distance apart from the longer side of the base diffusion region 17a. Inside the base diffusion region 17a, the part between the longer side of the base diffusion region 17a and the longer side of the source diffusion region 21 is formed as a channel region 22 in which an inversion layer is formed as will be described below. The base diffusion region 17a and the source diffusion region 21 are elongated, and therefore the channel region 22 is also elongated.

A gate insulating film 34 is provided on the channel region 22. The gate insulating film 34 extends slightly from the channel region 22 on both sides of the channel region 22, and therefore the widthwise ends of the gate insulating film 34 are positioned on the source diffusion region 21 and the resistance layer 15.

A gate electrode film 36 is provided on the surface of the gate insulating film 34, and an interlayer insulating film 37 is provided on the gate electrode film 36.

A source electrode film 38 is provided on the interlayer insulating film 37. The surface of the source diffusion region 21 and the surface of the Ohmic diffusion region 20 are at least partly exposed, and the source electrode film 38 is also provided at the exposed part. The source electrode film 38 is electrically connected to the source diffusion region 21 and the Ohmic diffusion region 20.

Consequently, the base diffusion region 17a is connected to the source electrode film 38 through the Ohmic diffusion region 20. The source diffusion region 21 and the base diffusion region 17a are thus short-circuited by the source electrode film 38. The interlayer insulating film 37 positioned between the source electrode film 38 and the gate electrode film 36 insulates the source electrode film 38 and the gate electrode film 36.

A drain electrode film 30 is provided on the surface of the semiconductor support layer 11 opposite to the side of the resistance layer 15. Unlike a Schottky junction type IGBT that will be described, the drain electrode film 30 and the semiconductor support layer 11 are in Ohmic contact and electrically connected with each other.

Now, the operation of the semiconductor device 1 will be described. In this case, the first conductivity type is N-type, and the second conductivity type is P-type. When a positive voltage equal to or more than the threshold voltage is applied to the gate electrode film 36 while the source electrode film 38 is grounded and the drain electrode film 30 is provided with positive voltage, an inversion layer having the opposite conductivity to that of the channel region 22 forms at the inner surface of the channel region 22. The source diffusion region 21 and the resistance layer 15 are connected by the inversion layer and attain a conduction state.

When the semiconductor device 1 is a MOS transistor, the semiconductor support layer 11 serves as a drain layer, and in a conduction state, current is passed from the drain electrode film 30 toward the source electrode film 38 through the inversion layer, the resistance layer 15, and the drain layer (semiconductor support layer 11).

Once the potential of the gate electrode film 36 is pulled to a level less than the threshold voltage (for example, by short-circuiting between the gate electrode film 36 and the source electrode film 38 from the conduction state), the inversion layer disappears, and a cutoff state is attained. In the cutoff state, no current is passed.

Figure 8:
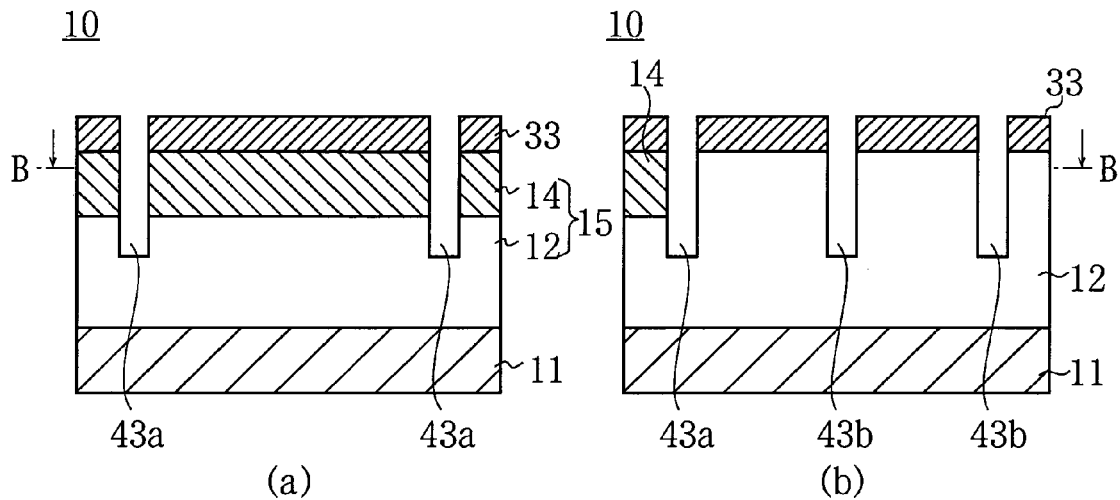
FIGS. 8(a) and 8(b) are views for illustrating the process of manufacturing the semiconductor device according to the invention (8)
Figure 9:
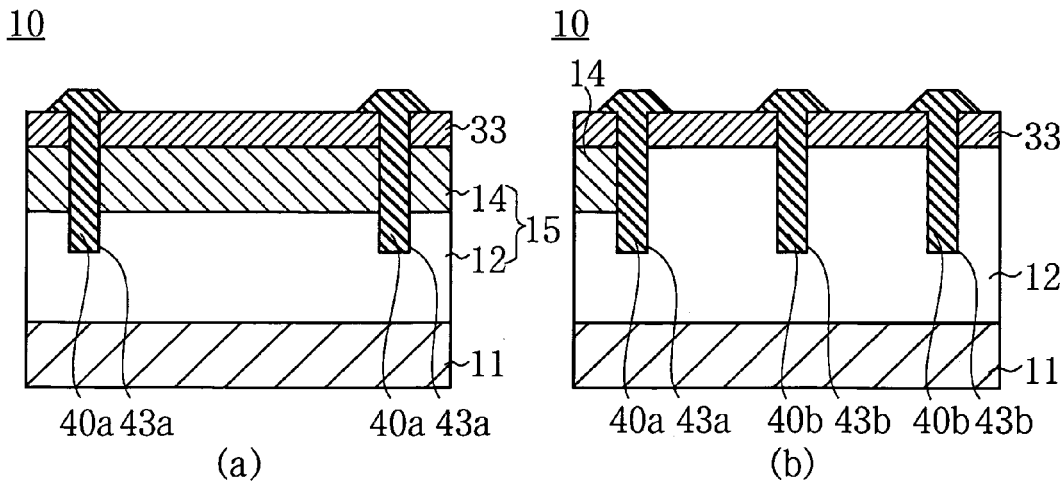
FIGS. 9(a) and 9(b) are views for illustrating the process of manufacturing the semiconductor device according to the invention (9)

As shown in FIG. 8(a), to be further discussed later, in the semiconductor device 1, the resistance layer 15 has an elongate groove 43a (which is formed after forming a conductive layer 14 in the embodiment, while it may be formed before forming the conductive layer 14). As shown in FIG. 9(a), a semiconductor material 40a of the second conductivity type fills the groove 43a, and a buried region 44a is formed by a part of the semiconductor material 40a below the base diffusion region 17a and the groove 43a.

As will be described, the upper part of the buried region 44a is connected to the base diffusion region 17a.

A PN junction is formed between the second conductivity type region including the base diffusion region 17a and the buried region 44a and the first conductivity type region including the resistance layer 15; and when the PN junction is reversely biased, a depletion layer expands from the PN junction into the base diffusion region 17a, the resistance layer 15, and the buried region 44a.

Now, the shape and position of the buried region 44a will be described. The depth $D_1$ of the groove 43a from the surface of the resistance layer 15 is not large enough to reach the semiconductor support layer 11 and is larger than the depth $D_2$ of the base diffusion region 17a and the depth of the conductive layer 14.

The base diffusion region 17a has its longitudinal direction arranged along the longitudinal direction of the groove 43a. The base diffusion region 17a is formed to have a width across a plurality of grooves 43a, and therefore at least two buried regions 44a are provided at the bottom of each of the base diffusion regions 17a.

The same number of buried regions 44a are provided at the bottom of each of the base diffusion regions 17a.

The base diffusion regions 17a are parallel to one another, and a plurality of buried regions 44a positioned at the bottom of one base diffusion region 17a are parallel to the longer side of the base diffusion region 17a to which their upper parts are connected. Therefore, the buried regions 44a are parallel to one another. The widths of the buried regions 44a are equal.

The connection part between the buried regions 44a and the base diffusion region 17a is positioned at the inner side of the base diffusion region 17a more than the channel region 22 so that the buried region 44a does not exist immediately under the channel region 22.

The distance between opposing side surfaces of the buried regions 44a is defined as the distance between the buried regions 44a, and the distance $Wm_1$ between the buried regions 44a under the bottom of the same base diffusion region 17a is equal (if at least three buried regions 44a are positioned under the bottom of one base diffusion region 17a).

The distance $Wm_1$ is also equal between the buried regions 44a positioned under the bottoms of different base diffusion regions 17a. Consequently, the distance $Wm_1$ is fixed for all the base diffusion regions 17a.

Figure 27:
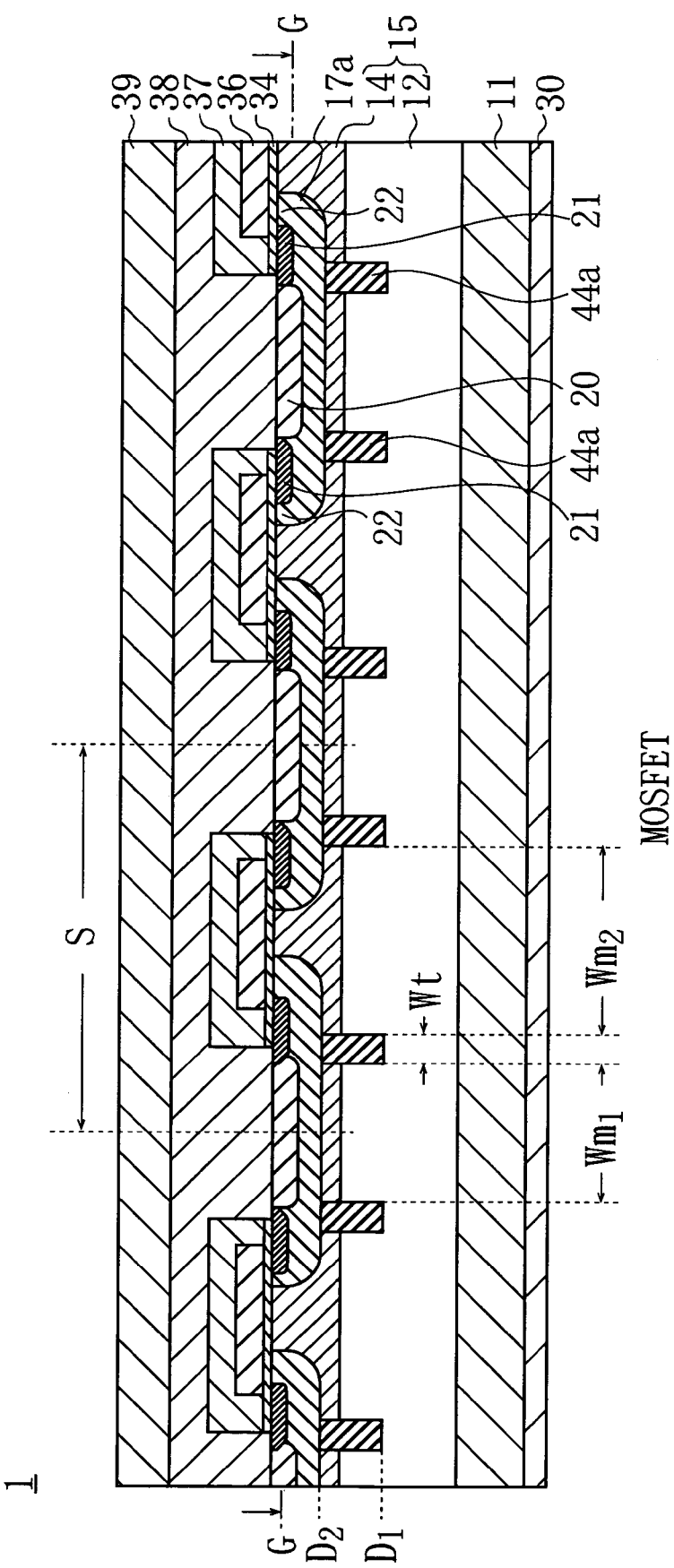
FIG. 27 is a sectional view of an active region part in a semiconductor device according to a first embodiment of the invention.

In FIG. 27, two buried regions 44a are positioned at the bottom of one base diffusion region 17a, and the distance $Wm_1$ is also the width of the resistance layer 15 between two buried region 44a positioned at the bottom of the same base diffusion region 17a.

When for a pair of two adjacent base diffusion regions 17a, the distance $Wm_2$ between the buried regions 44a positioned at the bottoms of different base diffusion regions 17a and opposing each other is fixed among each pair of base diffusion regions 17a.

Meanwhile, the distance $Wm_1$ between the buried regions 44a under the bottom of the same base diffusion region 17a and the distance $Wm_2$ between the buried regions 44a positioned at the bottoms of different base diffusion regions 17a and opposing each other are not necessarily equal.

The widths of the buried regions 44a represented by reference character Wt are equal. When the distance from the depth $D_2$ level of the base diffusion region 17a to the depth $D_1$ level of the bottom of the buried region 44a; that is, the height $D_1$-$D_2$ of the buried region 44a is H (which is larger than the depth of the base diffusion region 17a and shallower than the bottom of the buried region 44a), L represents the length of the buried region 44a, n represents the number of buried regions 44a positioned at the bottom of one base diffusion region 17a, Nd represents the average concentration of the first conductivity type impurity in the resistance layer 15 between the top (the bottom of the base diffusion region 17a) and bottom of the buried region 44a, and Na represents the average concentration of the second conductivity type impurity in the buried region 44a, the RESURF condition with equal amounts of the first conductivity type impurity and the second conductivity type impurity are represented by the following Expression (1):

$$\{Wm_1 \times (n-1) + Wm_2\} \times Nd \times H \times L = Wt \times n \times H \times L \times Na \quad (1)$$

Eliminating the height H and the length L from Expression (1) results in the following Expression (2):

$$\{Wm_1 \times (n-1) + Wm_2\} \times Nd = Wt \times n \times Na \quad (2)$$

Expressions (1) and (2) hold for the total impurity amount in the active region, while for each base diffusion region 17a, these expressions hold for the interval between center of width direction of one base diffusion region 17a to the center of width direction of the other base diffusion region 17a for every two adjacent base diffusion regions 17a. The reference character S in FIG. 27 represents one such interval between a pair of base diffusion regions 17a.

If the RESURF condition according to Expression (2) is satisfied, the base diffusion region 17a and the resistance layer 15 are reverse biased, and a part of the resistance layer 15 between the buried regions 44a is filled with a depletion layer, and the buried regions 44a is also filled inside with the depletion layer (provided that the electric field of the PN junction between the buried region 44a and the resistance layer 15 does not attain a critical level for avalanche breakdown before the resistance layer 15 and the buried region 44a are filled with the depletion layer).

When the magnitude of the reverse bias is in the level or greater, the depletion layer expands toward the direction of the semiconductor support layer 11, and avalanche breakdown occurs when the voltage is larger than the breakdown voltage.

Figure 36:
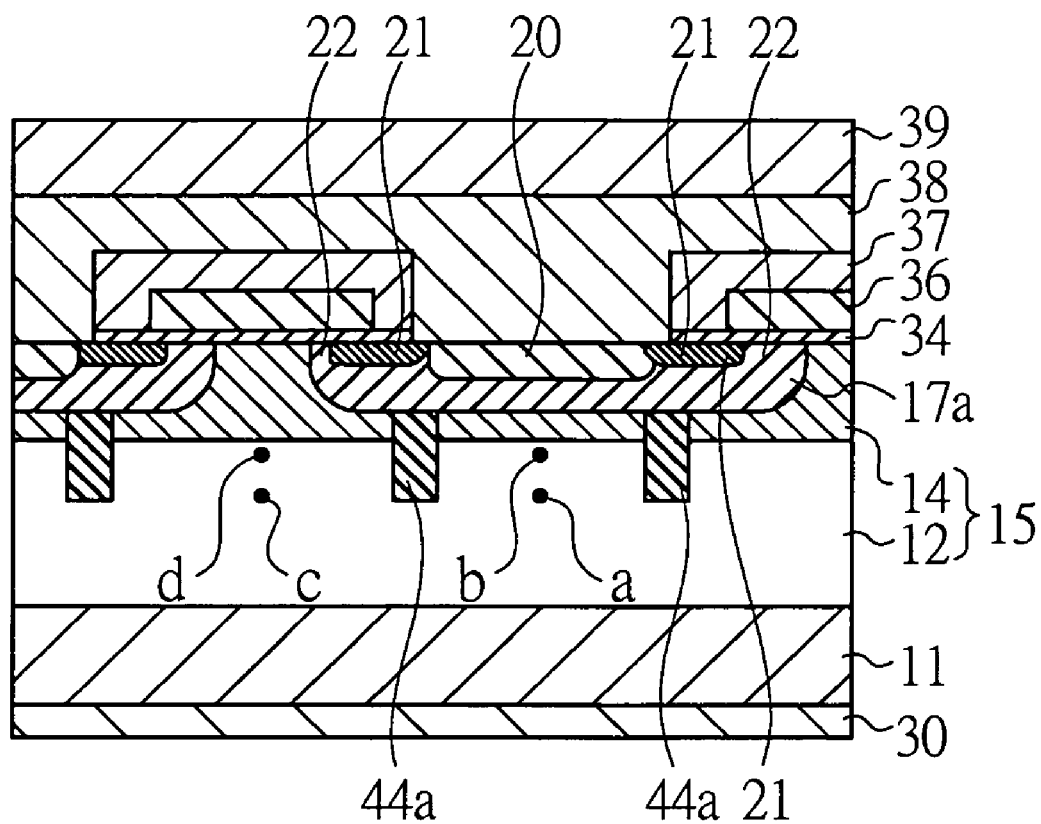
FIG. 36 is a sectional view for illustrating the position where avalanche breakdown occurs.
Figure 37:
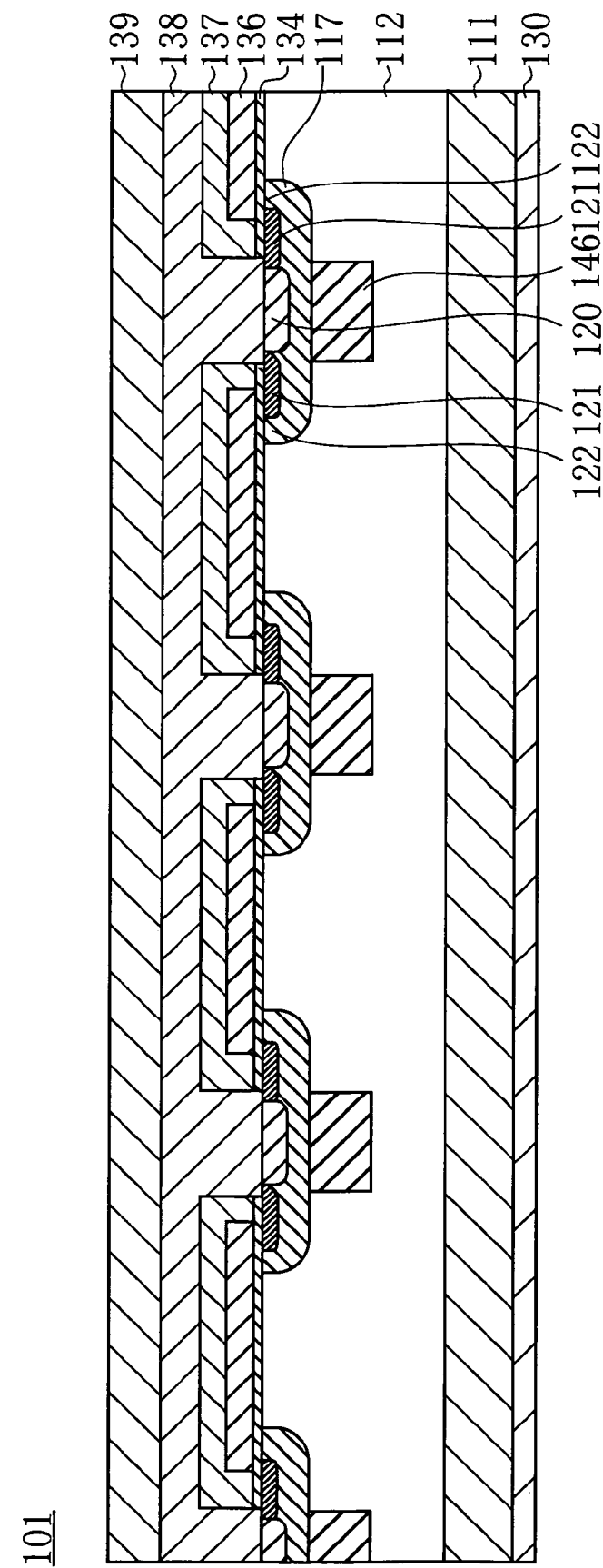
FIG. 37 is a sectional view for illustrating a conventional semiconductor device.

FIG. 36 is a view for illustrating where avalanche breakdown occurs, in which the reference character (a) represents a position between buried regions 44a connected to the same base diffusion region 17a and near the depth level of the bottom of the buried regions 44a, and the reference character (b) represents a position shallower and closer to the base diffusion region 17a.

The reference character (c) represents a position between adjacent base diffusion regions 17a and near the depth level of the bottom of the buried regions 44a, and the reference character (d) represents a position shallower and closer to the base diffusion region 17a.

If the RESURF condition according to Expression (2) is established, avalanche breakdown occurs somewhere near the positions (a) and (c) at the bottom level of the buried regions 44a or in a deeper position. In this case, the avalanche current is passed through the buried regions 44a, not through the part of the base diffusion region 17a under the bottom of the source diffusion region 21, and therefore a parasitic bipolar transistor is not turned on. Therefore, high withstand strength against destruction is secured.

If the RESURF condition according to Expression (2) is not established, there are two possibilities for each pair of two adjacent base diffusion regions 17a in the range S between the center of width direction of one base diffusion region 17a and the center of width direction of the other base diffusion region 17a and in the range H deeper than the depth of the base diffusion regions 17a and shallower than the bottom of the buried regions 44a. More specifically, in one case, the quantity Qd of the first conductivity type impurity is greater, and in the other case, the quantity Qa of the second conductivity type impurity is greater.

When the quantity Qd of the first conductivity type impurity is greater than the quantity Qa of the second conductivity type impurity, the resistance layer 15 has a high concentration, a depletion layer is not easily expanded to the resistance layer 15 from the PN junction between the base diffusion region 17a and the resistance layer 15, so that avalanche breakdown is likely to occur near the bottom of the base diffusion regions 17a.

In general, a region apart from the buried regions 44a is less likely to be filled with a depletion layer, and therefore avalanche breakdown is likely to occur somewhere away from the buried regions 44a.

Therefore, avalanche breakdown occurs in the position (b) under the bottom of the base diffusion region 17a and near the bottom of the base diffusion region 17a and is less likely to occur in the position (d) between the base diffusion regions 17a and near the depth level of the base diffusion regions 17a. This was established by simulations.

In this case, if the position of avalanche breakdown is near the bottom of the base diffusion region 17a, the avalanche current is not passed through the high resistance part under the bottom of the source diffusion region 21 so that a parasitic bipolar transistor is not turned on and breakdown is less likely to occur.

On the other hand, when the quantity Qa of the second conductivity type impurity is greater than the quantity Qd of the first conductivity type impurity, a depletion layer is easily expanded within the resistance layer 15. In this case, avalanche breakdown is more likely to occur in the deep position (c) at the narrow part between the buried regions 44a.

In either case, avalanche breakdown does not occur in the position (d) where destruction is likely to occur.

It is noted that according to the invention, the variables in Expression (2) are set to values that substantially satisfy Expression (2) and $Wm_1 > Wm_2$.

For $Wm_1 > Wm_2$ to be satisfied, $Wm_1 \geq Wm_2 \times 2$ is satisfied for example. If $Wm_2 = 3.5$ μm as an example, $Wm_1 = 7.0$ μm or more holds.

The relation between the position of avalanche breakdown and the concentration ratio Qd/Qa of the quantities of the first and second impurities was calculated.

The calculation condition is given in the following Table 1.

TABLE 1

| Caluculation Condition | |
|---|---|
| distance $Wm_1$ | 7.0 μm |
| distance $Wm_2$ | 3.5 μm |
| width Wt | 2.0 μm |
| growth layer concentration Nd | $2.86 \times 10^{15}$ cm$^{-3}$ |
| buried region depth $D_1$ | 30 μm |
| buried region concentration Na | $7.50 \times 10^{15}$ cm$^{-3}$ |
| base diffusion region depth $D_2$ | 1.5 μm |
| base diffusion region surface concentration | $1.00 \times 10^{18}$ cm$^{-3}$ |
| source diffusion reigion depth | 0.3 μm |
| Ohmic diffusion region depth | 1.0 μm |

The result of calculation is given in the following Table 2.

TABLE 2

Relation between Concentration and Breakdown Position

| Qd/Qa | Nd(cm$^{-3}$) | Na(cm$^{-3}$) | Position |
|---|---|---|---|
| 0.50 | $1.43 \times 10^{15}$ | $7.50 \times 10^{15}$ | c |
| 0.70 | $2.00 \times 10^{15}$ | $7.50 \times 10^{15}$ | c |
| 0.80 | $2.29 \times 10^{15}$ | $7.50 \times 10^{15}$ | c |
| 0.90 | $2.57 \times 10^{15}$ | $7.50 \times 10^{15}$ | a, c |
| 1.00 | $2.86 \times 10^{15}$ | $7.50 \times 10^{15}$ | a, c |
| 1.11 | $2.86 \times 10^{15}$ | $6.75 \times 10^{15}$ | between a and b |
| 1.25 | $2.86 \times 10^{15}$ | $6.00 \times 10^{15}$ | b |
| 1.43 | $2.86 \times 10^{15}$ | $5.25 \times 10^{15}$ | b |
| 2.00 | $2.86 \times 10^{15}$ | $3.75 \times 10^{15}$ | b |

$Wm_1(7.0$ μm$) > Wm_2(3.5$ μm$)$

When Qd/Qa=1.00, the RESURF condition according to Expression (2) is established. When Qd/Qa<1.00, the quantity Qa of the second conductivity type impurity is larger than the quantity Qd of the first conductivity type impurity. When 1.00<Qd/Qa, the quantity Qd of the first conductivity type impurity is larger than the quantity Qa of the second conductivity type impurity. Since the condition $Wm_1 > Wm_2$ holds for every case in the table, no avalanche breakdown occurs in the position (d).

As comparative examples, the position of breakdown was calculated for $Wm_1 < Wm_2$ and $Wm_1 = Wm_2$. The results of calculation are given in Tables 3 and 4.

TABLE 3

Relation between Concentration and Breakdown Position (Conparative Example)

| Qd/Qa | Nd(cm$^{-3}$) | Na(cm$^{-3}$) | Position |
|---|---|---|---|
| 0.50 | $1.43 \times 10^{15}$ | $7.50 \times 10^{15}$ | a |
| 0.70 | $2.00 \times 10^{15}$ | $7.50 \times 10^{15}$ | a |
| 0.80 | $2.29 \times 10^{15}$ | $7.50 \times 10^{15}$ | a |
| 6.90 | $2.57 \times 10^{15}$ | $7.50 \times 10^{15}$ | a |
| 1.00 | $2.86 \times 10^{15}$ | $7.50 \times 10^{15}$ | a, c |
| 1.11 | $2.86 \times 10^{15}$ | $6.75 \times 10^{15}$ | a, c |
| 1.25 | $2.86 \times 10^{15}$ | $6.00 \times 10^{15}$ | between c and d |
| 1.43 | $2.86 \times 10^{15}$ | $5.25 \times 10^{15}$ | d |
| 2.00 | $2.86 \times 10^{15}$ | $3.75 \times 10^{15}$ | d |

$Wm_1(3.5$ μm$) < Wm_2$ $(7.0$ μm$)$

TABLE 4

Relation between Concentration and Breakdown Position (Conparative Example)

| Qd/Qa | Nd(cm$^{-3}$) | Na(cm$^{-3}$) | Position |
|---|---|---|---|
| 0.50 | $1.43 \times 10^{15}$ | $7.50 \times 10^{15}$ | a, c |
| 0.70 | $2.00 \times 10^{15}$ | $7.50 \times 10^{15}$ | a, c |
| 0.80 | $2.29 \times 10^{15}$ | $7.50 \times 10^{15}$ | a, c |
| 0.90 | $2.57 \times 10^{15}$ | $7.50 \times 10^{15}$ | a, c |
| 1.00 | $2.86 \times 10^{15}$ | $7.50 \times 10^{15}$ | a, c |
| 1.11 | $2.86 \times 10^{15}$ | $6.75 \times 10^{15}$ | a, c |
| 1.25 | $2.86 \times 10^{15}$ | $6.00 \times 10^{15}$ | between a and b / between c and d |
| 1.43 | $2.86 \times 10^{15}$ | $5.25 \times 10^{15}$ | b |
| 2.00 | $2.86 \times 10^{15}$ | $3.75 \times 10^{15}$ | b |

$Wm_1(5.25$ μm$) = Wm_2(5.25$ μm$)$

When $Wm_1 < Wm_2$ and $Qd/Qa \geq 1.25$, an avalanche breakdown occurs in the position (d); i.e., the possibility of avalanche failure increases.

When $Wm_1 = Wm_2$ and Qd/Qa is more than 1.25, an avalanche breakdown occurs near the position (d); i.e., the possibility of avalanche failure increases.

Note that in the above description, two buried regions 44a are provided under the bottom of each of the base diffusion regions 17a, while three or more such buried regions may be provided. When the amount of the second conductivity type impurity is increased in order to satisfy Expression (2), the impurity concentration Na of the second conductivity type may be raised, the width Wt of the buried regions 44a may be increased or the number of the buried regions 44a positioned at the bottom of each of the base diffusion regions 17a may be increased. The increase in the width Wt restrains growth of the semiconductor material 40a in the inside surface of the groove 43a, and therefore the approach of increasing the number of buried regions 44a is preferable.

A method of manufacturing a semiconductor device according to the invention will now be described.

Figure 2:
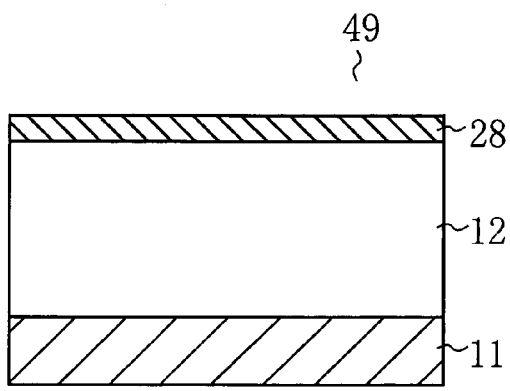
FIGS. 2(*a*) and 2(*b*) are views for illustrating the process of manufacturing the semiconductor device according to the invention (2)
Figure 2:
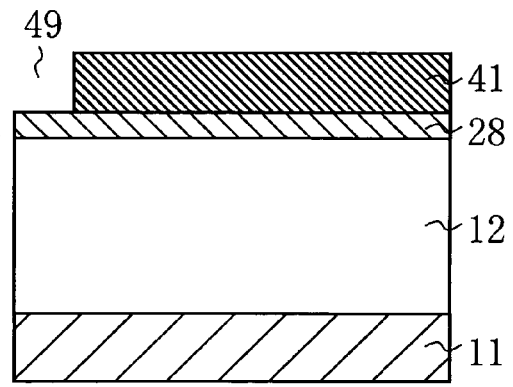

FIGS. 1(a), 2(a), . . . , and 26(a) are sectional views each showing the process in the active region in which the above-described base diffusion regions 17a are provided, and FIGS. 1(b), 2(b), . . . , and 26(b) are sectional views each showing a part near the outer periphery of the active region and a withstand voltage region around the active region.

The reference numeral 10 in FIGS. 1(a) and 1(b) shows a processed substrate for manufacturing the semiconductor device according to the invention thereon.

The processed substrate 10 has a semiconductor support layer 11 formed of a single crystal of a semiconductor of first conductivity type, and a growth layer 12 of a crystal of a semiconductor of the same conductivity type as that of the semiconductor support layer 11 epitaxially grown on the surface of the semiconductor support layer 11.

An initial oxide film 28 made of oxide of the single crystal of semiconductor is formed on the surface of the growth layer 12 by thermal oxidation treatment.

Now, a resist film is formed on the surface of the processed substrate 10 and patterned, so that a square opening 49 is formed in a position of the resist film on the active region as shown in FIGS. 2(a) and 2(b). The reference numeral 41 in FIG. 2(b) denotes the patterned resist film, and the initial oxide film 28 is exposed at the bottom of the opening 49.

Figure 3:
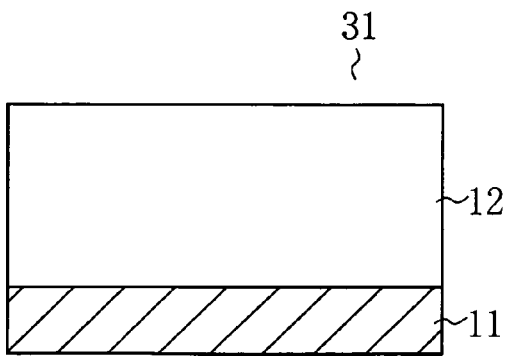
FIGS. 3(*a*) and 3(*b*) are views for illustrating the process of manufacturing the semiconductor device according to the invention (3)
Figure 3:
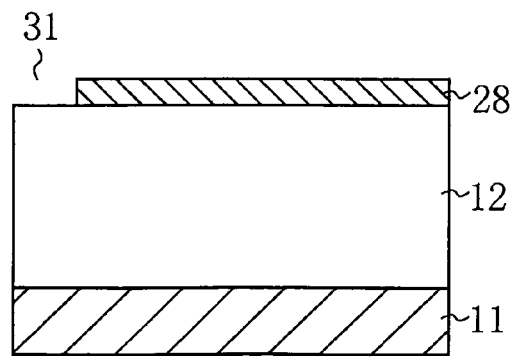

The initial oxide film 28 positioned at the bottom of the opening 49 is etched away, and then as shown in FIGS. 3(a) and 3(b), an opening 31 having the same shape as that of the opening 49 of the resist film 41 is formed at the initial oxide film 28. The surface of the growth layer 12 is exposed at the bottom of the opening 31. In the state in FIGS. 3(a) and 3(b), the resist film 41 has been removed.

Figure 4:
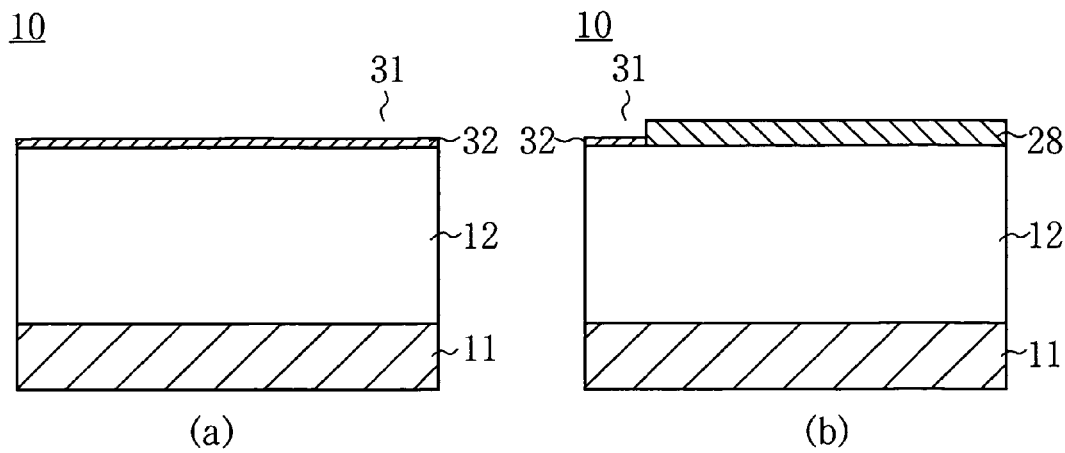
FIGS. 4(*a*) and 4(*b*) are views for illustrating the process of manufacturing the semiconductor device according to the invention (4)

Then, after thermal oxidation treatment, as shown in FIGS. 4(a) and 4(b), a buffer layer 32 formed of oxide of the semiconductor forming the growth layer 12 is formed at the bottom of the opening 31. The buffer layer 32 has a thin thickness.

Figure 5:
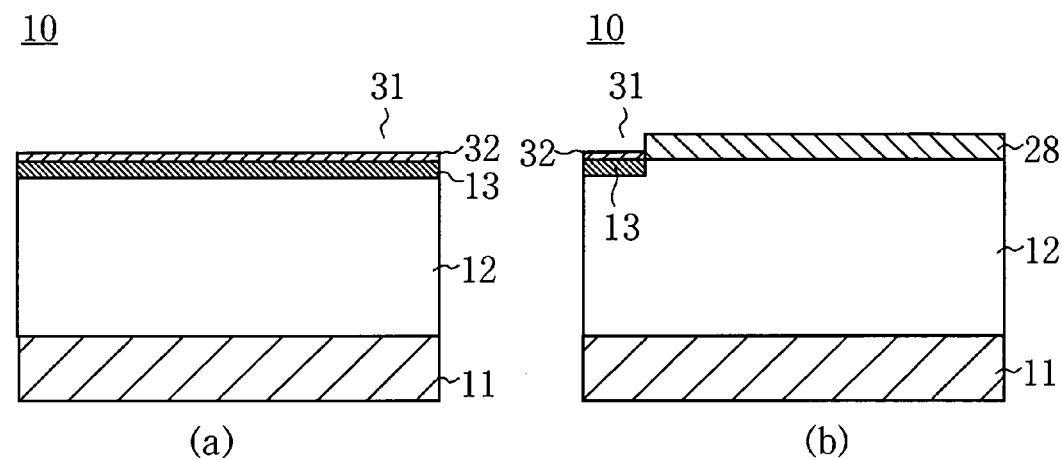
FIGS. 5(*a*) and 5(*b*) are views for illustrating the process of manufacturing the semiconductor device according to the invention (5)

In this state, the first conductivity type impurity is irradiated to the processed substrate 10 from its surface, and the impurity is blocked by the initial oxide film 28 and transmitted through the buffer layer 32 so that a high concentration impurity layer 13 of the first conductivity type is formed at the inner surface of the growth layer 12 at the bottom of the opening 31 as shown in FIGS. 5(a) and 5(b). The depth of the high concentration impurity layer 13 is small.

Figure 6:
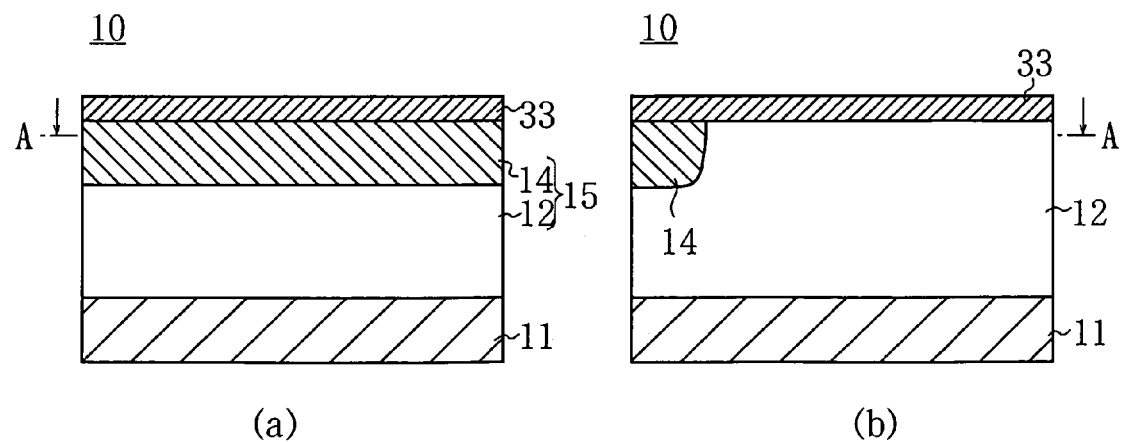
FIGS. 6(*a*) and 6(*b*) are views for illustrating the process of manufacturing the semiconductor device according to the invention (6)

Then, after thermal oxidation treatment, the impurity of the first conductivity type contained in the high concentration impurity layer 13 diffuses in the depth-wise direction and the lateral direction, and as shown in FIGS. 6(a) and 6(b), a conductive layer 14 of the first conductivity type is formed in the active region. The conductive layer 14 and the growth layer 12 form a resistance layer 15 of the first conductivity type.

At the time, by the thermal oxidation during the diffusion, a semiconductor thermal oxide film is formed on the surface of the processed substrate 10. The reference numeral 33 in FIGS. 6(a) and 6(b) denotes a mask oxide film integrated with the thermal oxide film, the buffer film 32, and the initial oxide film 28.

The surface concentration of the conductive layer 14 is higher than the concentration of the growth layer 12 by about 10 times in magnitude. The conductive layer 14 is formed by diffusion, and therefore the concentration is high at the surface and is reduced as the depth increases.

It is noted that the conductive layer 14 and the growth layer 12 are of the same conductivity type and do not form a PN junction. Therefore, according to the invention, the depth of the conductive layer 14 is defined in the position where the layer has its concentration reduced to a value twice that of the growth layer 12.

Figure 29:
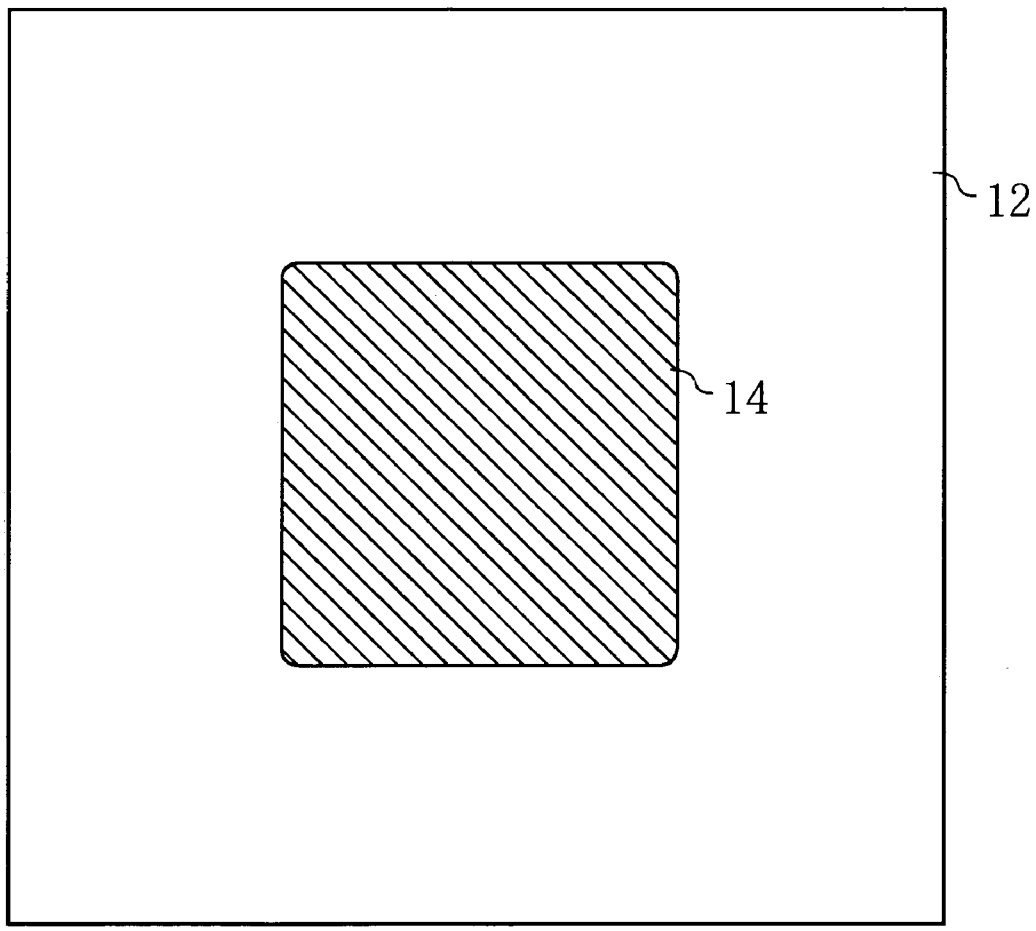
FIG. 29 is a sectional view taken along the line A-A in FIGS. 6(a) and 6(b)

FIG. 29 is a sectional view taken along the line A-A in FIGS. 6(a) and 6(b). By the lateral diffusion of the first conductivity type impurity, the two-dimensional shape of the conductive layer 14 is larger than that of the high concentration impurity layer 13 and in a square having its four corners rounded.

Figure 7:
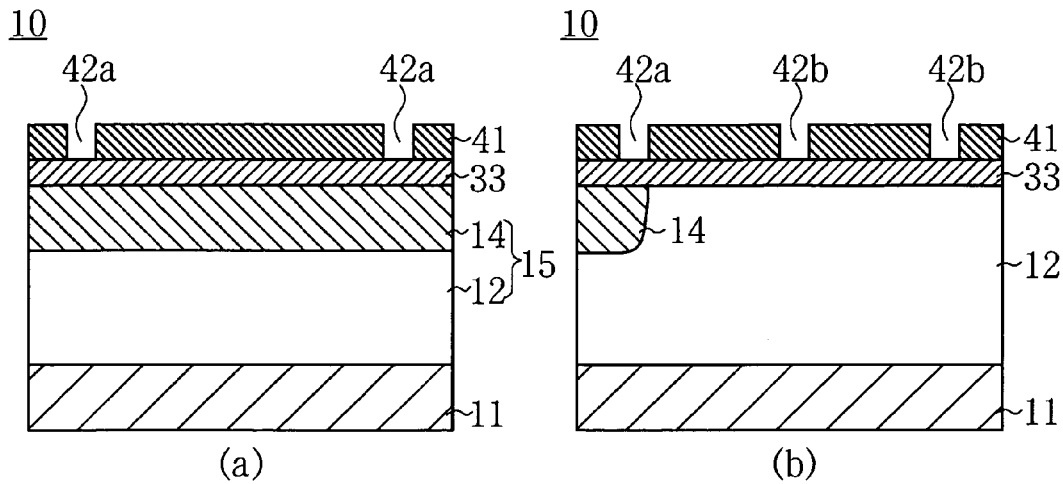
FIGS. 7(a) and 7(b) are views for illustrating the process of manufacturing the semiconductor device according to the invention (7)

Consequently, a resist film is formed on the mask oxide film 33 and patterned, and as shown in FIG. 7(a), a plurality of parallel long and narrow openings 42a are formed in the active region. As shown in FIG. 7(b), a plurality of ring-shaped openings 42b are formed in the withstand voltage region. The reference numeral 41 denotes the resist film having the openings 42a and 42b.

The long and narrow openings 42a have an elongate rectangular shape, and the ring-shaped openings 42b have square ring shapes (rectangles or regular squares) in different sizes. The ring-shaped openings 42b are provided concentrically, while the elongate openings 42a are surrounded by the ring-shaped openings 42b.

Opposing sides of adjacent ring-shaped openings 42b are provided parallel to one another, and the four sides of the long and narrow openings 42a are either parallel or perpendicular to the sides of the ring-shaped openings 42b.

The surface of the mask oxide film 33 is exposed through the bottom of the openings 42a and 42b. The mask oxide film 33 positioned at the openings 42a and 42b is etched away, the mask oxide film 33 is patterned, and then the resist film 41 is removed. Then, using the mask oxide film 33 as a mask, the resistance layer 15 is etched, so that active grooves 43a are formed at the bottom of the long and narrow openings 42a as shown in FIGS. 8(a) and 8(b), and withstand voltage grooves 43b are formed at the bottom of the ring-shaped openings 42b.

Figure 30:
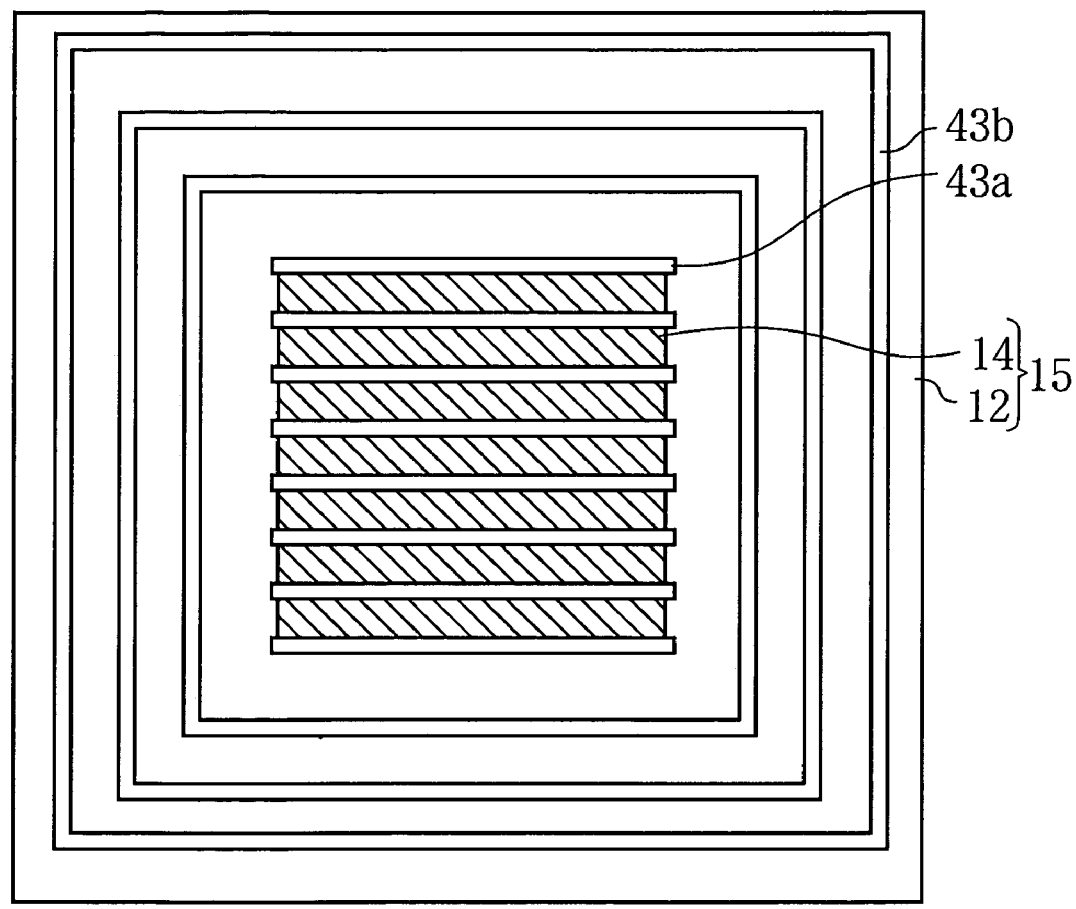
FIG. 30 is a sectional view taken along the line B-B in FIGS. 8(a) and 8(b)

FIG. 30 is a sectional view taken along the line B-B in FIGS. 8(a) and 8(b).

The two-dimensional shape of the active groove 43a is a long and narrow rectangular shape which is the same as the elongate opening 42a, and the shape of the withstand voltage groove 43b is a square ring which is the same as that of the ring-shaped opening 42b.

The relative position between the active grooves 43a is determined when the openings 42a are formed. Therefore, the above described condition, $Wm_1 > Wm_2$ is defined by the distance between the openings 42a.

The depths of the active groove 43a and the withstand voltage groove 43b are equal, greater than that of the conductive layer 14, and not large enough to reach the semiconductor support layer 11. Therefore, the growth layer 12 is exposed at the bottoms of the grooves 43a and 43b. The bottoms of the grooves 43a and 43b are parallel to the surface of the growth layer 12, and the side surfaces of the grooves 43a and 43b are perpendicular to the bottom surfaces.

Then, a monocrystalline or polycrystalline semiconductor of the second conductivity type is allowed to grow on the bottom surfaces and the side surfaces inside the grooves 43a and 43b by CVD. As shown in FIGS. 9(a) and 9(b), the grooves 43a and 43b are filled with semiconductor materials 40a and 40b of the second conductivity type made of the grown monocrystalline or polycrystalline semiconductor.

Figure 10:
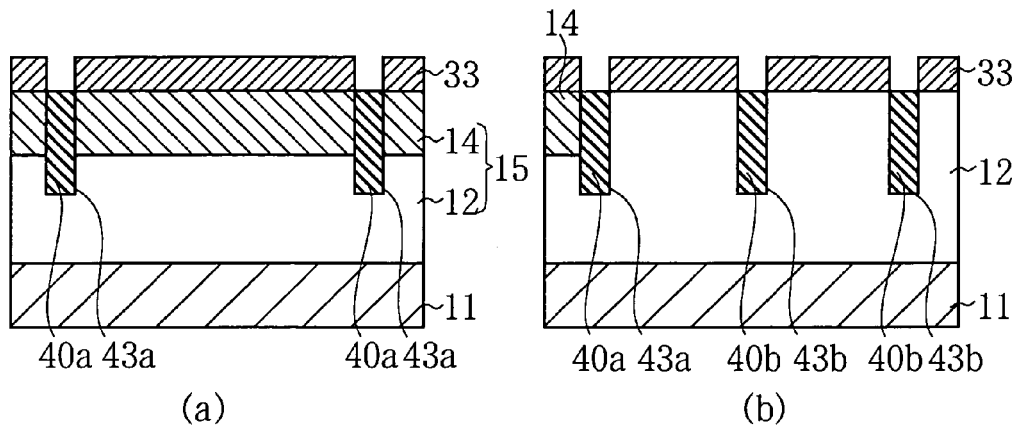
FIGS. 10(a) and 10(b) are views for illustrating the process of manufacturing the semiconductor device according to the invention (10)
Figure 11:
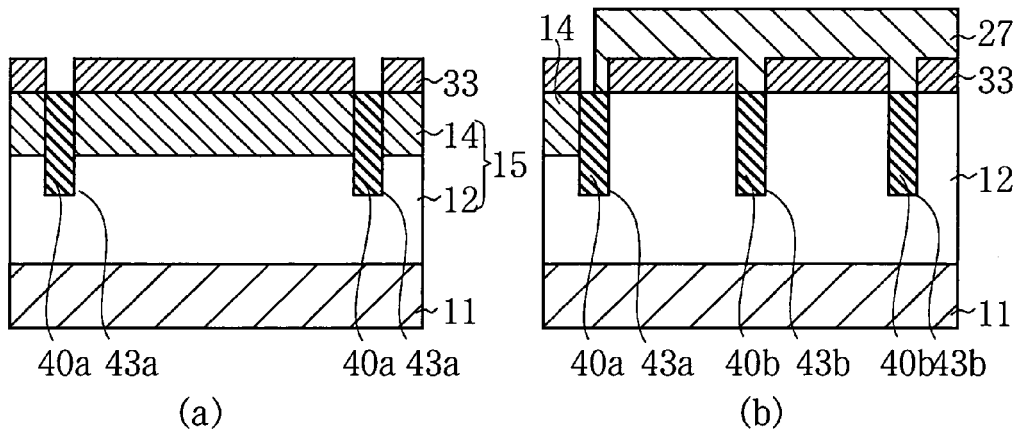
FIGS. 11(a) and 11(b) are views for illustrating the process of manufacturing the semiconductor device according to the invention (11)

Immediately after the filling process, the upper part of the semiconductor materials 40a and 40b protrude from the surface of the mask oxide film 33, and the part above the resistance layer 15 is etched away as shown in FIGS. 10(a) and 10(b). Then, as shown in FIGS. 11(a) and 11(b), while the surface of the mask oxide film 33 positioned on the conductive layer 14 is kept exposed, a patterned resist film 27 is provided on the mask oxide film 33 in close contact with the growth layer 12.

Figure 12:
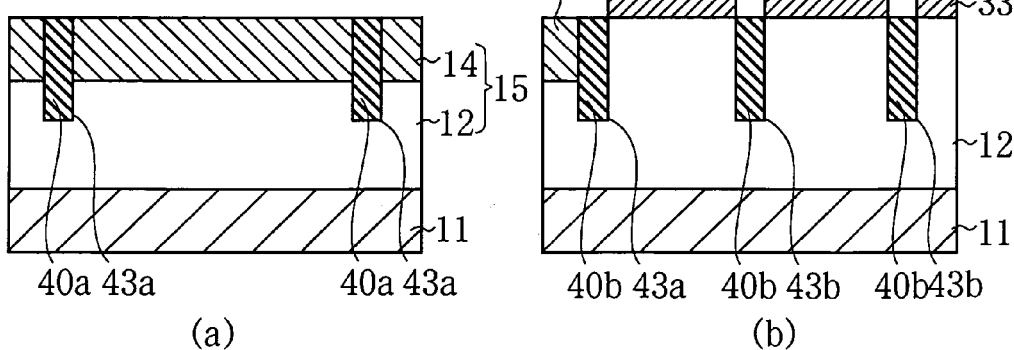
FIGS. 12(a) and 12(b) are views for illustrating the process of manufacturing the semiconductor device according to the invention (12)

As shown in FIGS. 12(a) and 12(b), by etching carried out in the state, the mask oxide film 33 in close contact with the growth layer 12 remains and while the surface of the resistance layer 15 in the withstand voltage region (surface of the growth layer 12) is covered, the conductive layer 14 in the active region and the semiconductor materials 40a and 40b in the active region and the withstand voltage region are exposed.

Figure 13:
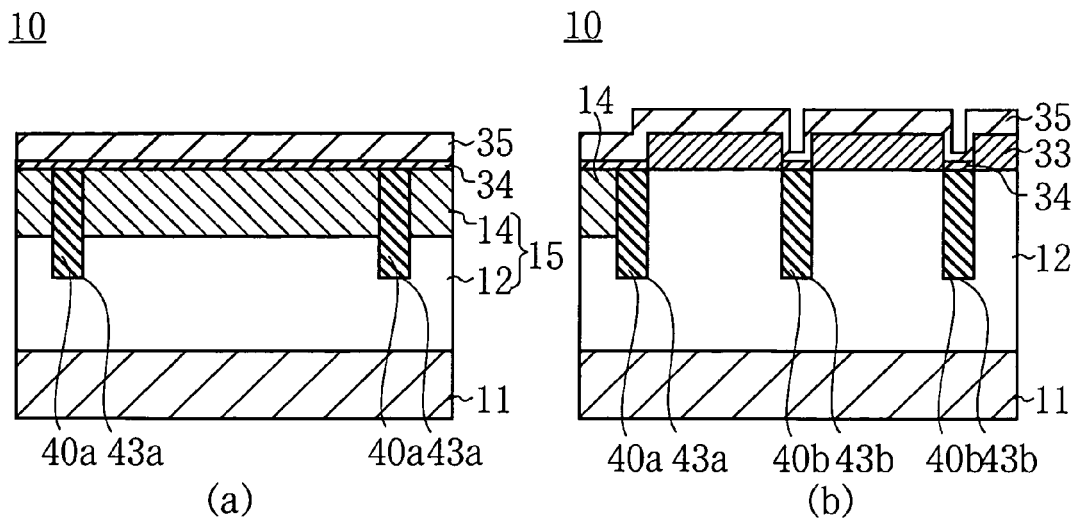
FIGS. 13(a) and 13(b) are views for illustrating the process of manufacturing the semiconductor device according to the invention (13)

Accordingly, by thermal oxidation treatment, a thin gate insulating film 34 is formed as shown in FIGS. 13(a) and 13(b), and then a thin conductive polysilicon film is deposited on the surface of the gate insulating film 34 by CVD or the like to form a thin conductive film 35 formed of polysilicon.

Figure 14:
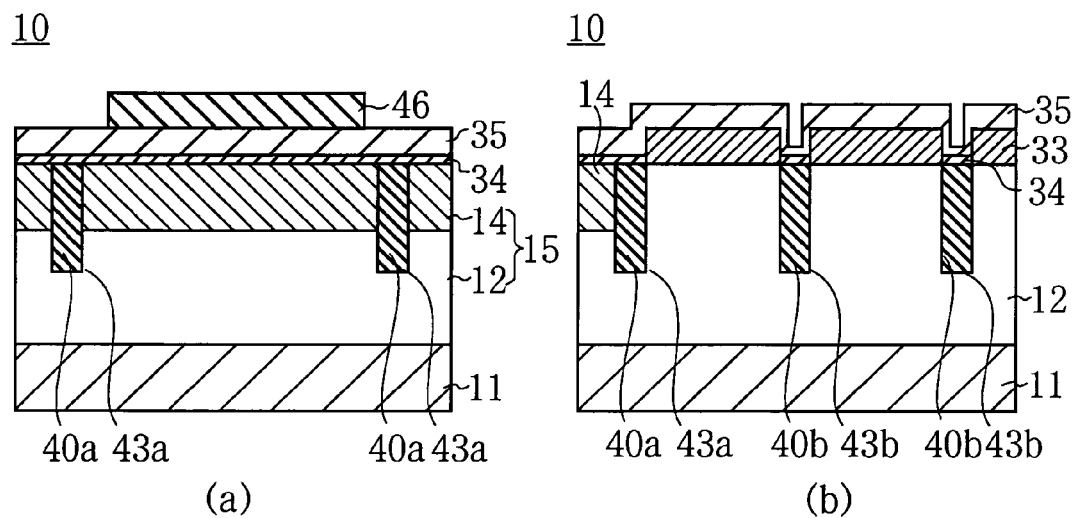
FIGS. 14(a) and 14(b) are views for illustrating the process of manufacturing the semiconductor device according to the invention (14)
Figure 15:
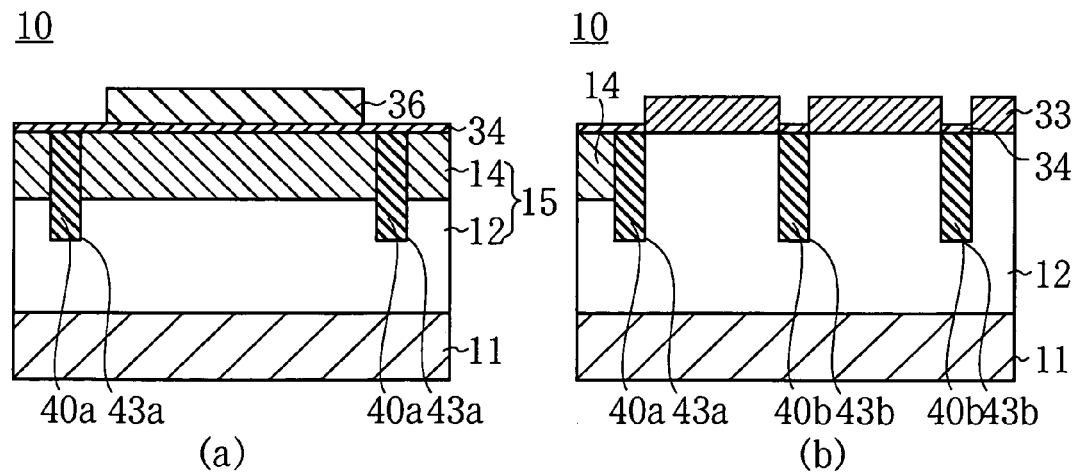
FIGS. 15(a) and 15(b) are views for illustrating the process of manufacturing the semiconductor device according to the invention (15)

Subsequently, as shown in FIGS. 14(a) and 14(b), a patterned resist film 46 is arranged in a predetermined position on the thin conductive film 35, the thin conductive film 35 is patterned by etching, and a gate electrode film 36 is formed as shown in FIGS. 15(a) and 15(b).

Figure 16:
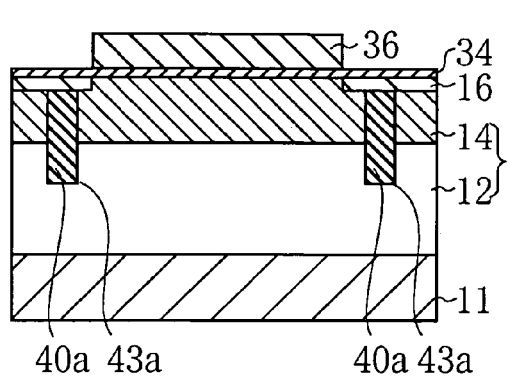
FIGS. 16(a) and 16(b) are views for illustrating the process of manufacturing the semiconductor device according to the invention (16)
Figure 16:
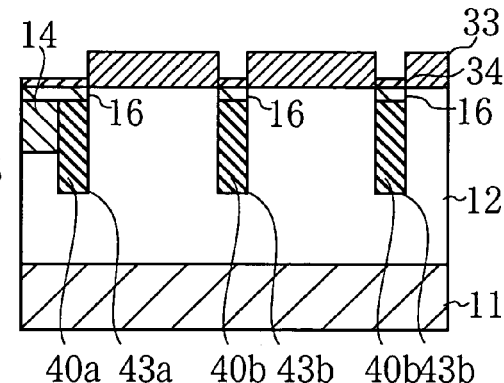

Next, when a second conductivity type impurity is irradiated onto the surface of the processed substrate 10, the impurity is transmitted through the exposed gate insulating film 34. With the gate electrode film 36 and the mask oxide film 33 serving as a mask, the irradiated second conductivity type impurity is formed into a high concentration impurity region 16 of the second conductivity type on the inner surface of the conductive layer 14, and the inner surfaces of the semiconductor materials 40a and 40b in the active groove 43a and the withstand voltage groove 43b as shown in FIGS. 16(a) and 16(b).

Figure 17:
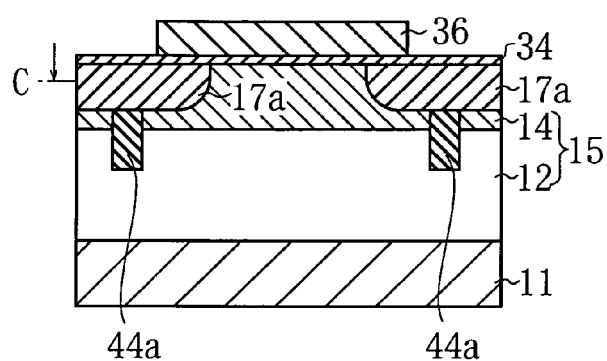
FIGS. 17(a) and 17(b) are views for illustrating the process of manufacturing the semiconductor device according to the invention (17)
Figure 17:
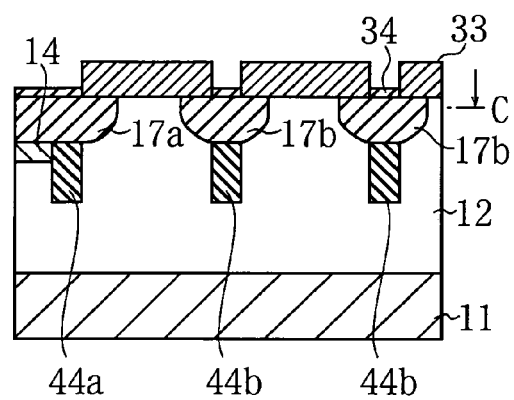

Accordingly, the second conductivity type impurity contained in the high concentration impurity region 16 is diffused by thermal treatment, and a base diffusion region 17a and a sub guard diffusion region 17b of the second conductivity type are formed in the active region and the withstand voltage region, as shown in FIGS. 17(a) and 17(b), respectively.

The base diffusion region 17a and the sub guard diffusion region 17b are equal in depth and shallower than the conductive layer 14.

Since the concentration of the second conductivity type impurity contained in the base diffusion region 17a and the sub guard diffusion region 17b is higher than the concentration of the second conductivity type impurity contained in the semiconductor materials 40a and 40b, the parts of the semiconductor materials 40a and 40b in a shallower level than the base diffusion region 17a and the sub guard diffusion region 17b are assumed to be replaced by the base diffusion region 17a and the sub guard diffusion region 17b, respectively.

In such a case, the remainder (the lower part) of the active groove 43a and the semiconductor material 40a filled therein form a buried region 44a of the second conductivity type at the bottom of the base diffusion region 17a. The remainder (lower part) of the withstand voltage groove 43b and the semiconductor material 40b filled therein form a main guard region 44b of the second conductivity type at the bottom of the sub guard diffusion region 17b.

The buried regions 44a are elongate and parallel to one another. The buried region 44a is formed in a lower position than the bottom of the base diffusion region 17a and has a lateral rectangular parallelepiped shape. The upper part of the buried region 44a is connected to the base diffusion region 17a and therefore attains the same potential as that of the base diffusion region 17a.

In the upper part of the semiconductor material 40b filled in the withstand voltage groove 43b, a high concentration impurity region 16 having the same width as that of the semiconductor material 40b is formed, while the lateral diffusion allows the width of the sub guard diffusion region 17b to have a larger width than that of the main guard region 44b.

Figure 31:
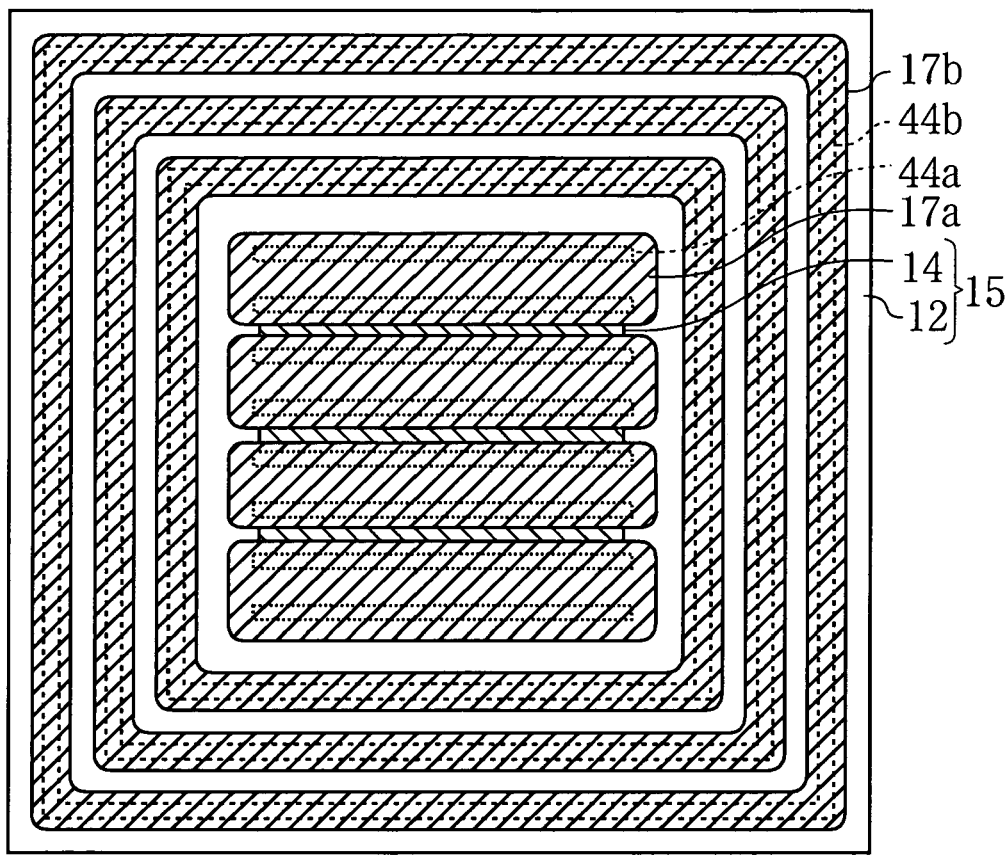
FIG. 31 is a sectional view taken along the line C-C in FIGS. 17(a) and 17(b)

FIG. 31 is a sectional view taken along the line C-C in FIGS. 17(a) and 17(b).

The base diffusion regions 17a each has a rectangular shape with its four corners rounded and its longer sides extended in the direction in which the buried region 44a extends.

The base diffusion regions 17a are provided apart from one another, and the lateral diffusion of the second conductivity type impurity allows the edge of the base diffusion region 17a to come under the bottom of the gate electrode film 36 so that the gate electrode film 36 is provided to span the adjacent base diffusion regions 17a.

The sub guard diffusion regions 17b have square ring shapes, and the sub guard diffusion regions 17b are arranged concentrically adjacent one another at a predetermined distance between one another.

Figure 18:
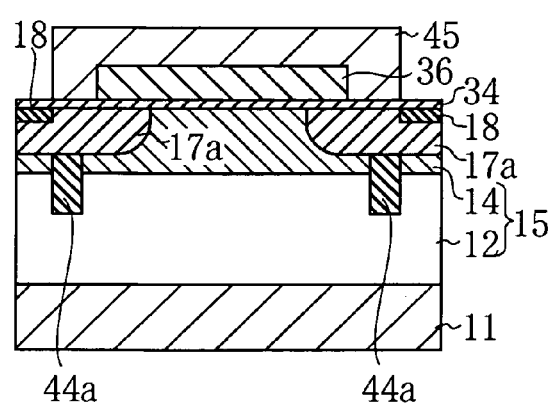
FIGS. 18(a) and 18(b) are views for illustrating the process of manufacturing the semiconductor device according to the invention (18)
Figure 18:
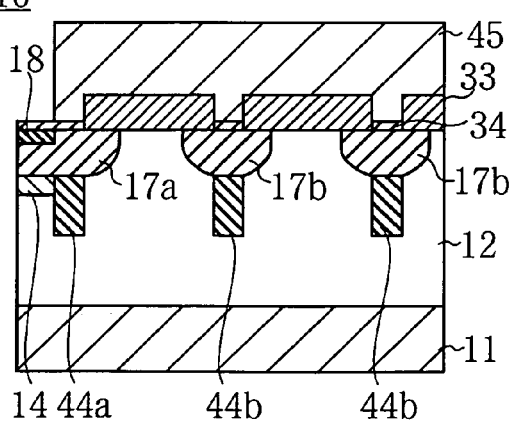

As such, as shown in FIGS. 18(a) and 18(b), a patterned resist film 45 is provided on the surface of the processed substrate 10, a second conductivity type impurity is irradiated while the gate insulating film 34 at the center of width direction of the base diffusion region 17a is exposed. The second conductivity type impurity transmitted through the gate insulating film 34 forms a high concentration impurity layer 18 of the second conductivity type at the inner surface of the base diffusion region 17a.

The high concentration impurity layer 18 of the second conductivity type has a rectangular shape having its longer sides provided along the longitudinal direction of the base diffusion region 17a, and the longer sides of the high concentration impurity layer 18 and the longer sides of the base diffusion region 17a are parallel to one another.

Figure 19:
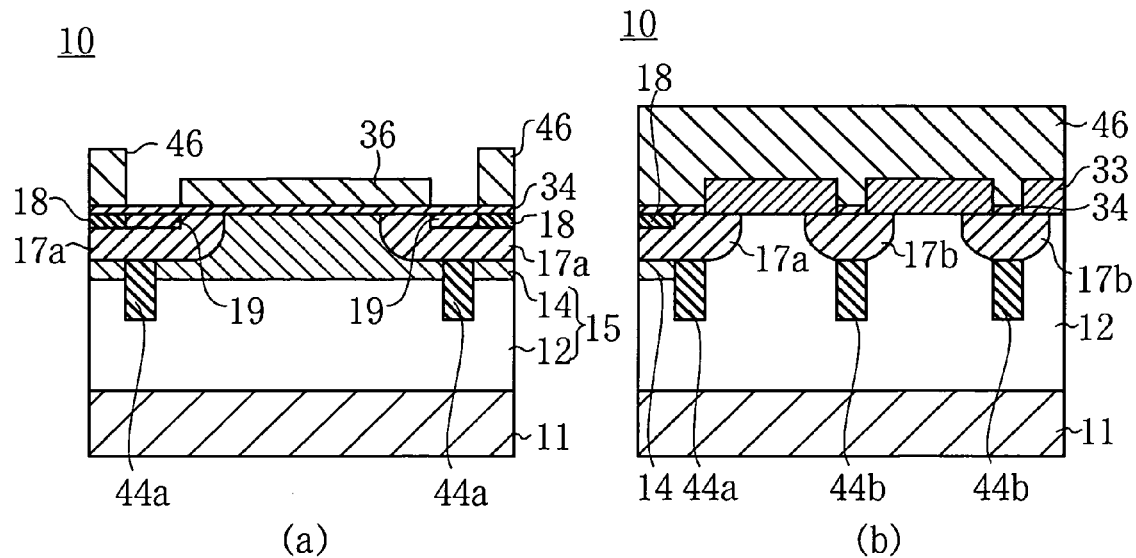
FIGS. 19(a) and 19(b) are views for illustrating the process of manufacturing the semiconductor device according to the invention (19)

The longer sides of the high concentration impurity layer 18 are provided a predetermined distance apart from the edges of the gate electrode film 36. The resist film 45 is removed, and another patterned resist film 46 is formed as shown in FIGS. 19(a) and 19(b). When the surface of the gate insulating film 34 positioned between the longer side of the high concentration impurity layer 18 and the edge of the gate electrode film 36 is exposed while the other part is covered, and an impurity of the first conductivity type is irradiated, the impurity is transmitted through the exposed part of the gate insulating film 34, and a high concentration impurity region 19 of the first conductivity type is formed at the inner surface of the base diffusion region 17a between the high concentration impurity region 18 of the second conductivity type and the gate electrode film 36.

Figure 20:
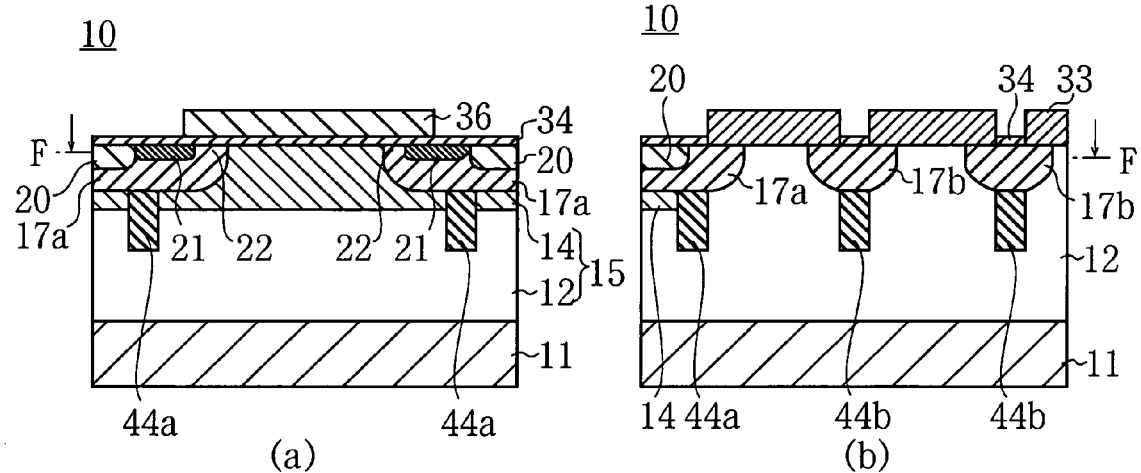
FIGS. 20(a) and 20(b) are views for illustrating the process of manufacturing the semiconductor device according to the invention (20)

After the resist film 46 is removed, thermal treatment is carried out so that the impurities contained in the high concentration impurity region 18 of the second conductivity type and the high concentration impurity region 19 of the first conductivity type both diffuse. As shown in FIGS. 20(a) and 20(b), an Ohmic diffusion region 20 of the second conductivity type and a source diffusion region 21 of the first conductivity type are formed respectively. The surface concentration of the Ohmic diffusion region 20 is higher than that of the base diffusion region 17a. Both the source diffusion region 21 and the Ohmic diffusion region 20 form an Ohmic contact with a metal film.

Figure 32:
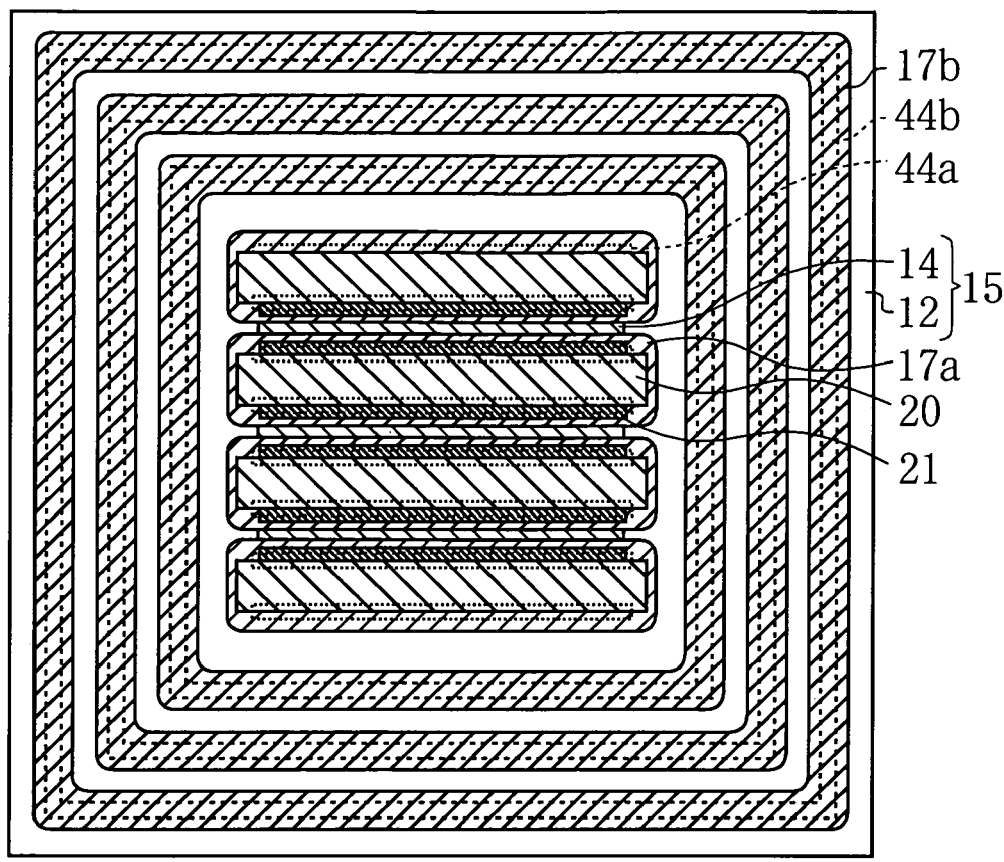
FIG. 32 is a sectional view taken along the line F-F in FIGS. 20(a) and 20(b)

FIG. 32 is a sectional view taken along the line F-F in FIGS. 20(a) and 20(b).

The two-dimensional shapes of the Ohmic diffusion region 20 and the source diffusion region 21 have a size smaller than the base diffusion region 17a and a depth smaller than that of the base diffusion region 17a. The Ohmic diffusion region 20 and the source diffusion region 21 are positioned on the inner side of the base diffusion region 17a and not in contact with the conductive layer 14 and the growth layer 12.

At least one Ohmic diffusion region 20 and at least one source diffusion region 21 are formed in each of the base diffusion regions 17a.

The end of the source diffusion region 21 comes under the bottom of the gate electrode film 36 by lateral diffusion but does not come into contact with the end of the base diffusion region 17a. The part of the base diffusion region 17a positioned at the bottom of the gate electrode film 36 and in contact with the gate insulating film 34 between the edge of the source diffusion region 21 and the edge of the base diffusion region 17a form a channel region 22.

Figure 21:
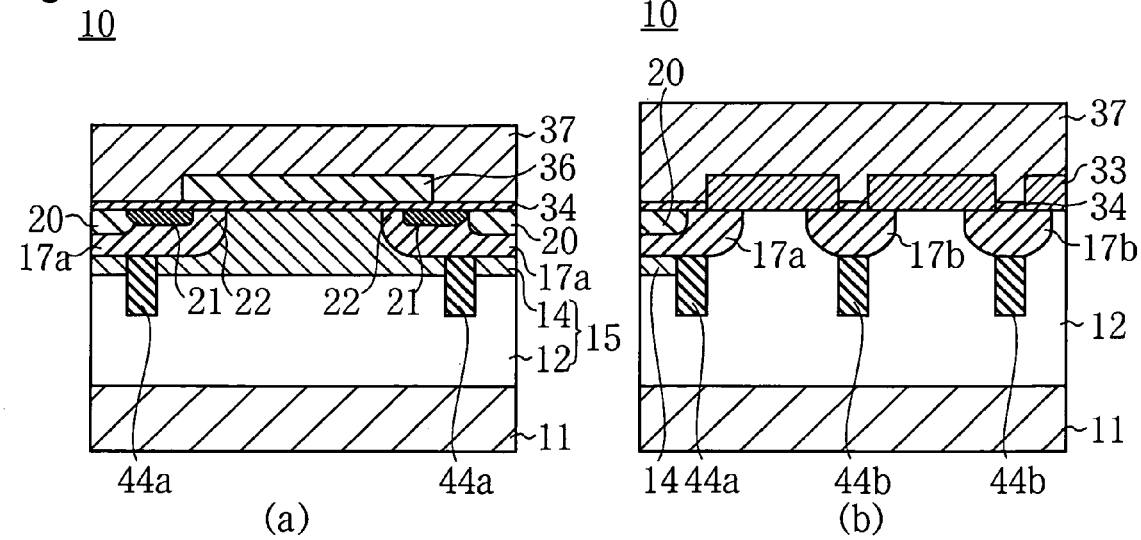
FIGS. 21(a) and 21(b) are views for illustrating the process of manufacturing the semiconductor device according to the invention (21)
Figure 22:
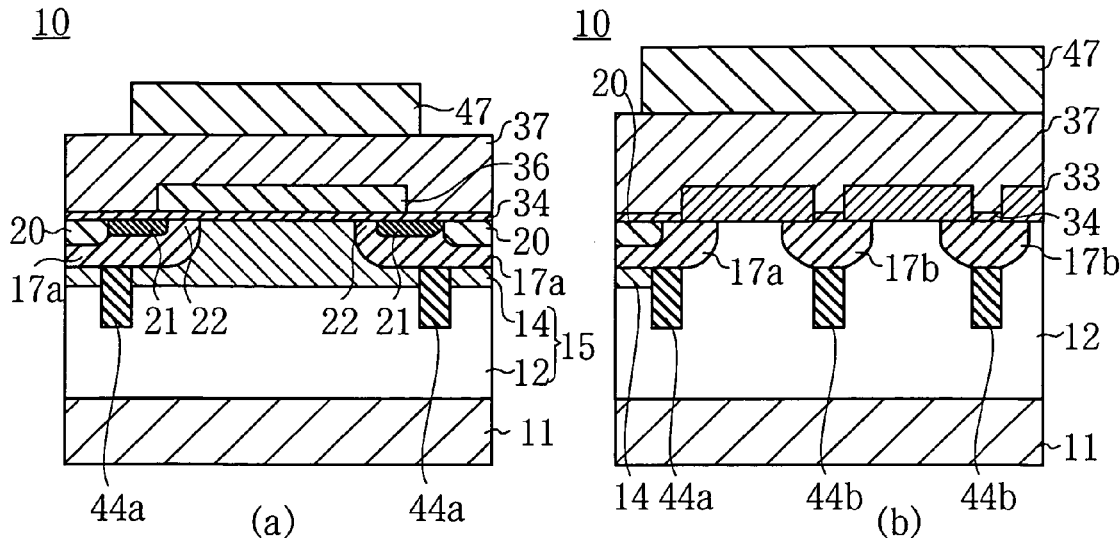
FIGS. 22(a) and 22(b) are views for illustrating the process of manufacturing the semiconductor device according to the invention (22)
Figure 23:
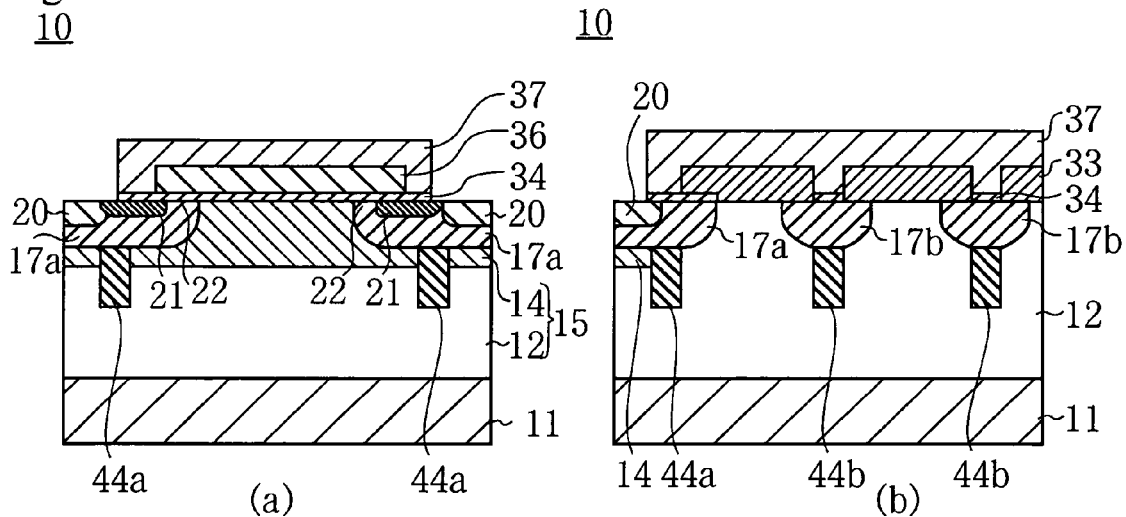
FIGS. 23(a) and 23(b) are views for illustrating the process of manufacturing the semiconductor device according to the invention (23)
Figure 24:
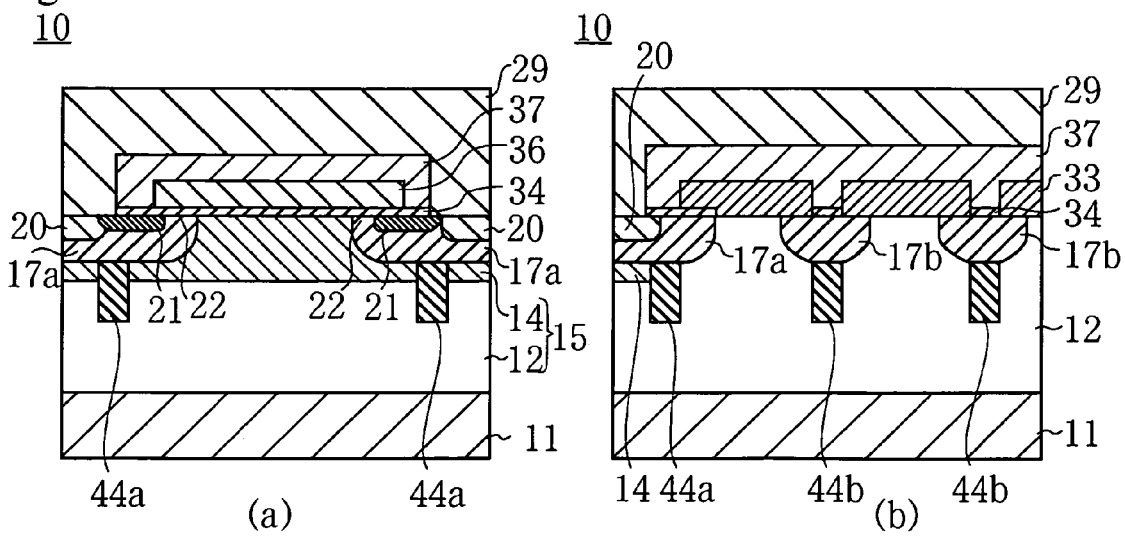
FIGS. 24(a) and 24(b) are views for illustrating the process of manufacturing the semiconductor device according to the invention (24)

Consequently, as shown in FIGS. 21(a) and 21(b), after the interlayer insulating film 37 such as a silicon oxide film is formed on the surface of the processed substrate 10 by CVD or the like, a patterned resist film 47 is provided on the gate electrode film 36 in the active region and the surface of the withstand voltage region as shown in FIGS. 22(a) and 22(b). The exposed interlayer insulating film 37 and the underlying gate insulating film 34 are etched to expose at least a part of the surface of the Ohmic diffusion region 20 and the source diffusion region 21. As shown in FIGS. 24(a) and 24(b), a thin metal film 29 such as an aluminum film is then formed so that the part of the surface of the Ohmic diffusion region 20 and the part of the surface of the source diffusion region 21 are in contact with the thin metal film 29.

Figure 25:
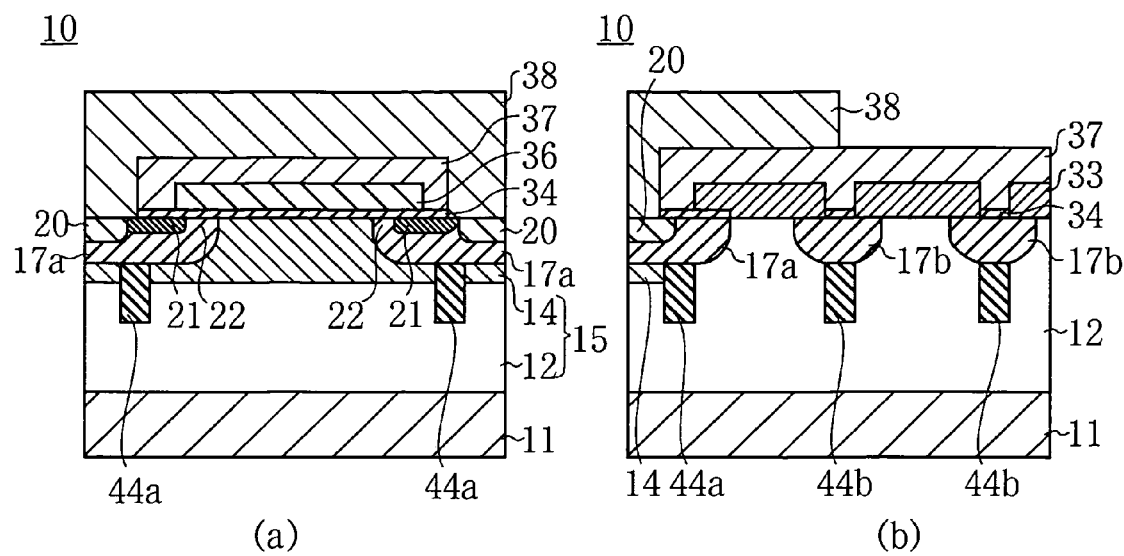
FIGS. 25(a) and 25(b) are views for illustrating the process of manufacturing the semiconductor device according to the invention (25)

A patterned resist film (not shown) is then arranged on the thin metal film 29, and the thin metal film 29 is patterned by etching so that a source electrode film 38 is formed as shown in FIG. 25.

At the time of forming the source electrode film 38, a gate pad made of the metal film forming the source electrode film 38, which is insulated from the source electrode film 38, and connected to the gate electrode film 36 and a source pad made of a part of the source electrode film 38 are formed.

The source electrode film 38 is in Ohmic contact with the source diffusion region 21 and the Ohmic diffusion region 20. The source diffusion region 21 is directly electrically connected to the source electrode film 38, and the base diffusion region 17a is electrically connected to the source electrode film 38 through the Ohmic diffusion region 20.

The buried region 44a is in contact with the base diffusion region 17a and is thus electrically connected with the source electrode film 38. The source electrode film 38 is electrically insulated from the gate electrode film 36 by the interlayer insulating film 37, and not in contact with the conductive layer 14 and the growth layer 12.

Figure 26:
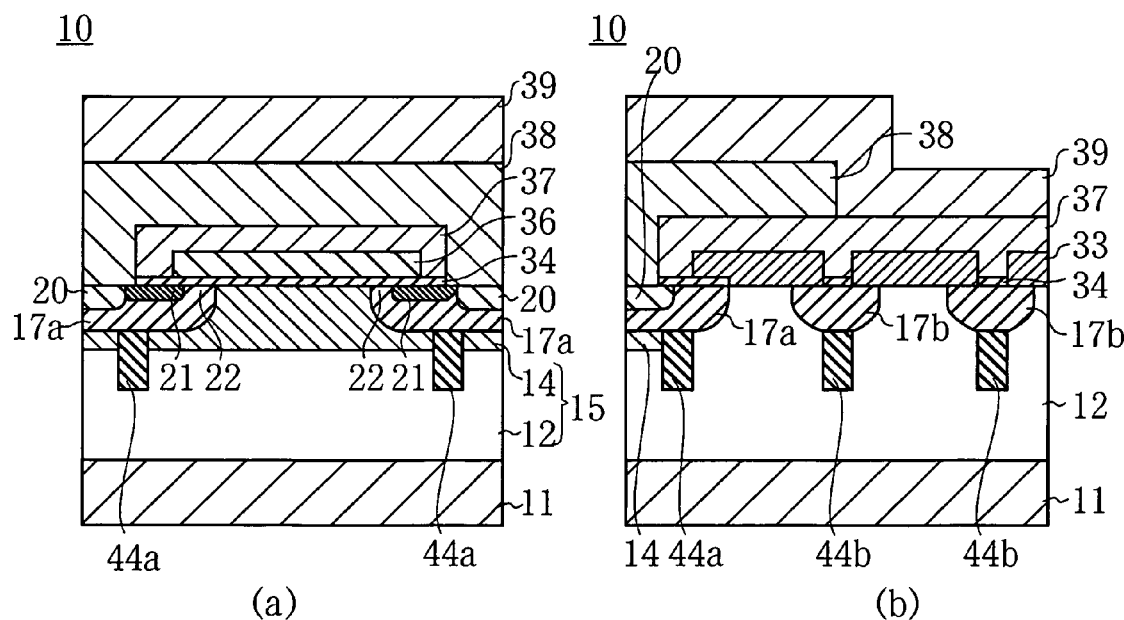
FIGS. 26(a) and 26(b) are views for illustrating the process of manufacturing the semiconductor device according to the invention (26)

As shown in FIGS. 26(a) and 26(b), a protective layer 39 made, for example, of a silicon oxide film is then formed on the surface of the processed substrate 10, and the protective layer 39 is patterned by etching. The patterning exposes the gate pad and the source pad.

Figure 28:
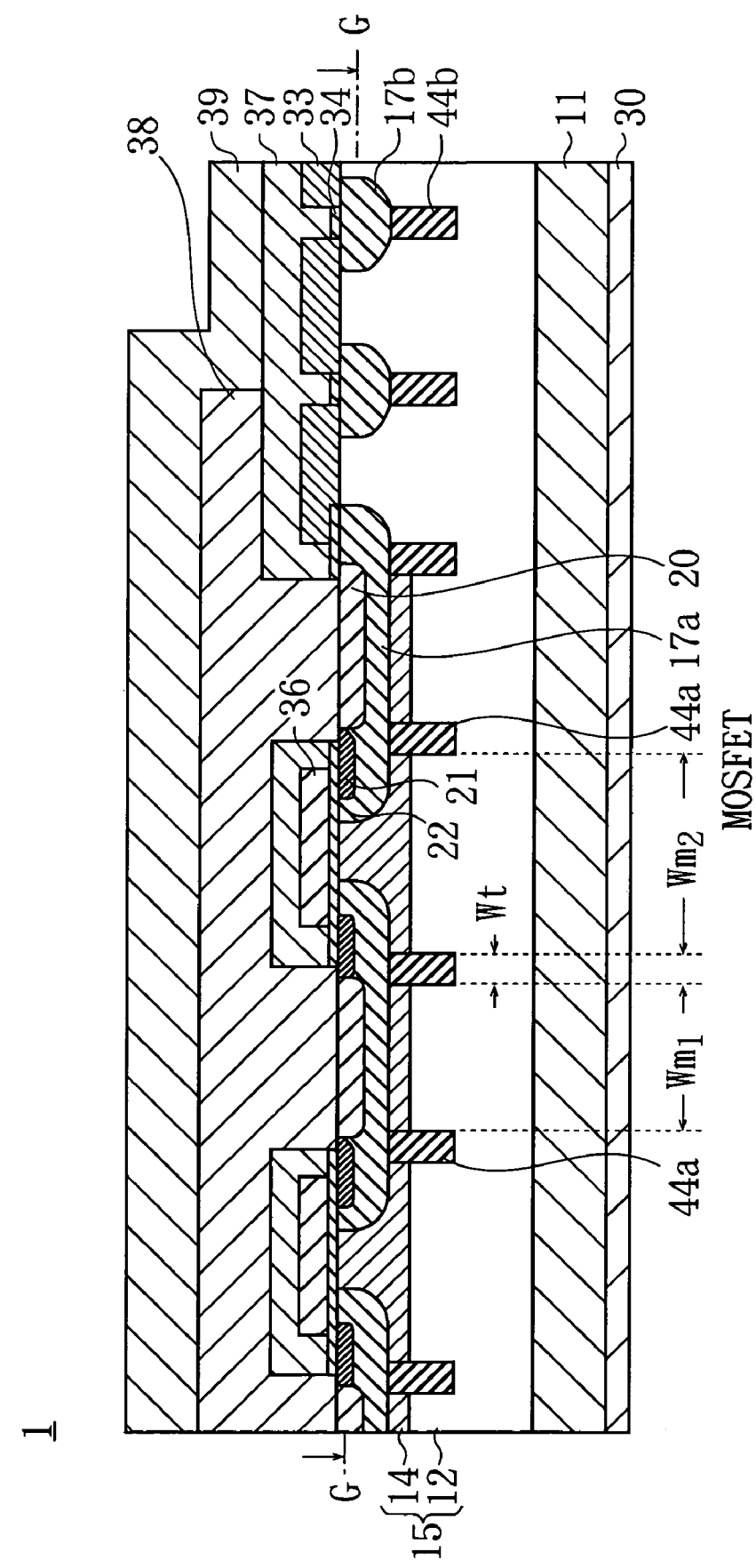
FIG. 28 is a sectional view of a withstand voltage region part in the semiconductor device according to the first embodiment of the invention.

As shown in FIGS. 27 and 28, a metal film is formed on the exposed surface of the semiconductor support layer 11 on the backside, and the metal film forms the drain electrode film 30. After dicing, a plurality of semiconductor devices 1 is obtained from the one wafer.

The drain electrode film 30 is in Ohmic contact with the semiconductor support layer 11. The growth layer 12 and the conductive region 14 are electrically connected to the drain electrode film 30 through the semiconductor support layer 11.

It is noted that the sectional view taken along the line G-G in FIGS. 27 and 28 is the same as the sectional view taken along the line F-F in FIGS. 20(a) and 20(b), which is shown in FIG. 32.

In the foregoing, the semiconductor device 1 according to the invention is a MOS transistor, while the invention may be applied to other semiconductor devices.

Figure 33:
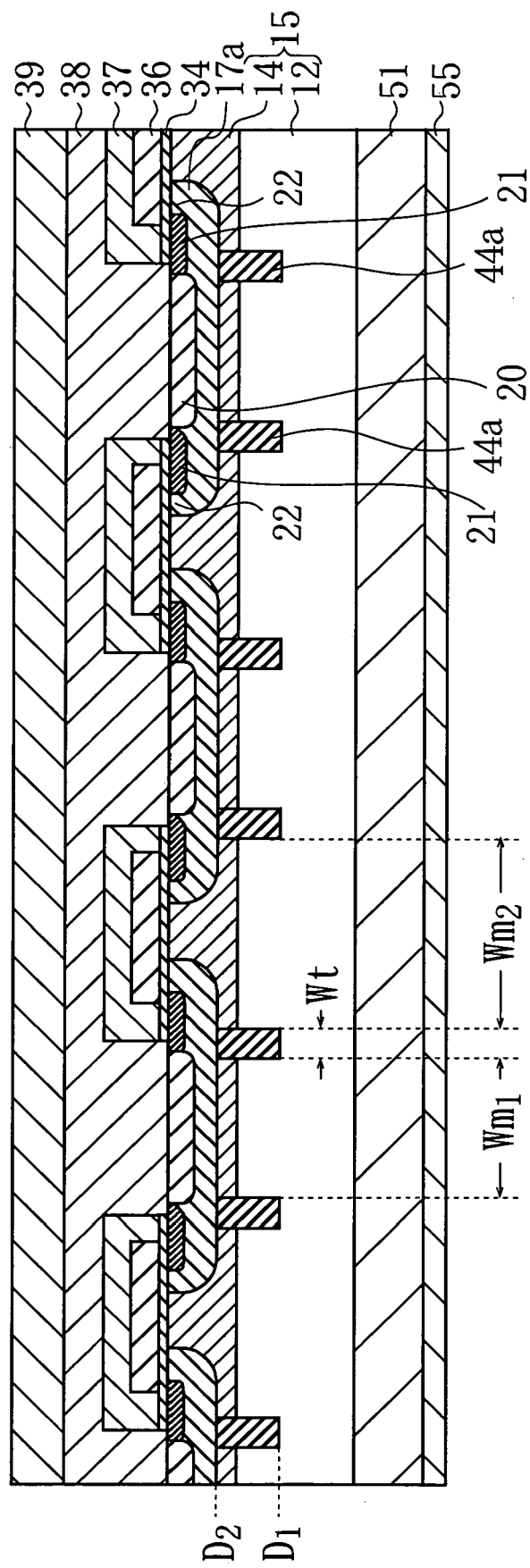
FIG. 33 is a sectional view for illustrating a semiconductor device according to a second embodiment of the invention.

The reference numeral 2 in FIG. 33 denotes a PN junction IGBT semiconductor device according to a second embodiment of the invention. In the description of the semiconductor device 2 according to the second embodiment and semiconductor devices 3 and 4 as will be described as embodiments, the same elements as those of the semiconductor device 1 in the first embodiment are denoted by the same reference characters and will not be described. Among the following embodiments, the structure of the withstand voltage region at least in the semiconductor devices 2 and 3 in the second and third embodiments is the same as that of the semiconductor 1 in the first embodiment.

The semiconductor device 2 according to the second embodiment has a collector layer 51 of the second conductivity type in place of the support layer 11 of the first conductivity type. A growth layer 12 of the first conductivity type is provided on the collector layer 51. A collector electrode 55 in Ohmic contact with the collector layer 51 is formed on the back surface of the collector layer 51. The other structure is the same as that of the semiconductor 1 according to the first embodiment.

In the semiconductor device 2, a PN junction is formed between the collector layer 51 and the growth layer 12, and when the semiconductor device 2 conducts, the PN junction is forward-biased, and minority carriers are injected from the collector layer 51 into the growth layer 12 so that the conduction resistance is lowered.

Figure 34:
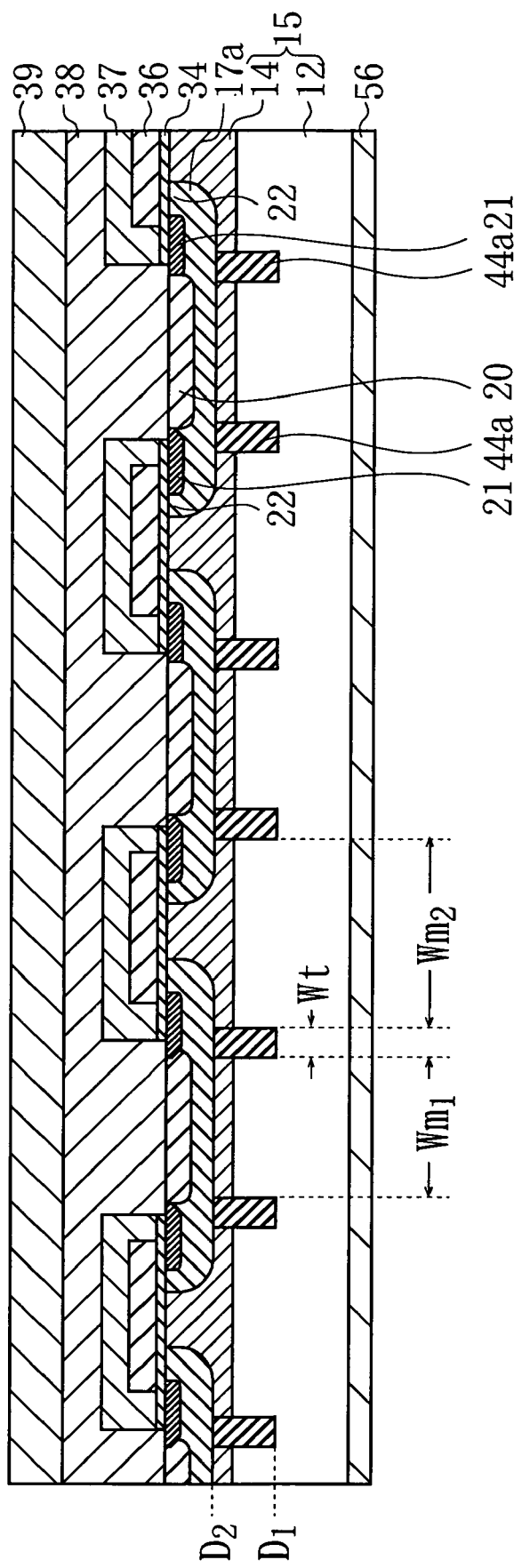
FIG. 34 is a sectional view for illustrating a semiconductor device according to a third embodiment of the invention.

The reference numeral 3 in FIG. 34 denotes a Schottky junction type IGBT semiconductor device according to the third embodiment of the invention.

In the semiconductor device 3, after the part corresponding to the semiconductor support layer 11 of the semiconductor device 1 according to the first embodiment is removed by polishing or the like, a metal film (such as, a chromium film forming a Schottky junction with the growth layer 12) is formed on the surface of the growth layer 12 exposed by the polishing. The metal film forms a Schottky electrode film 56.

The polarity of the Schottky junction is a polarity to be forward-biased as the semiconductor device 3 conducts. When the Schottky junction is forward-biased, minority carriers are injected from the Schottky electrode film 56 into the growth layer 12, which lowers the conduction resistance.

Figure 35:
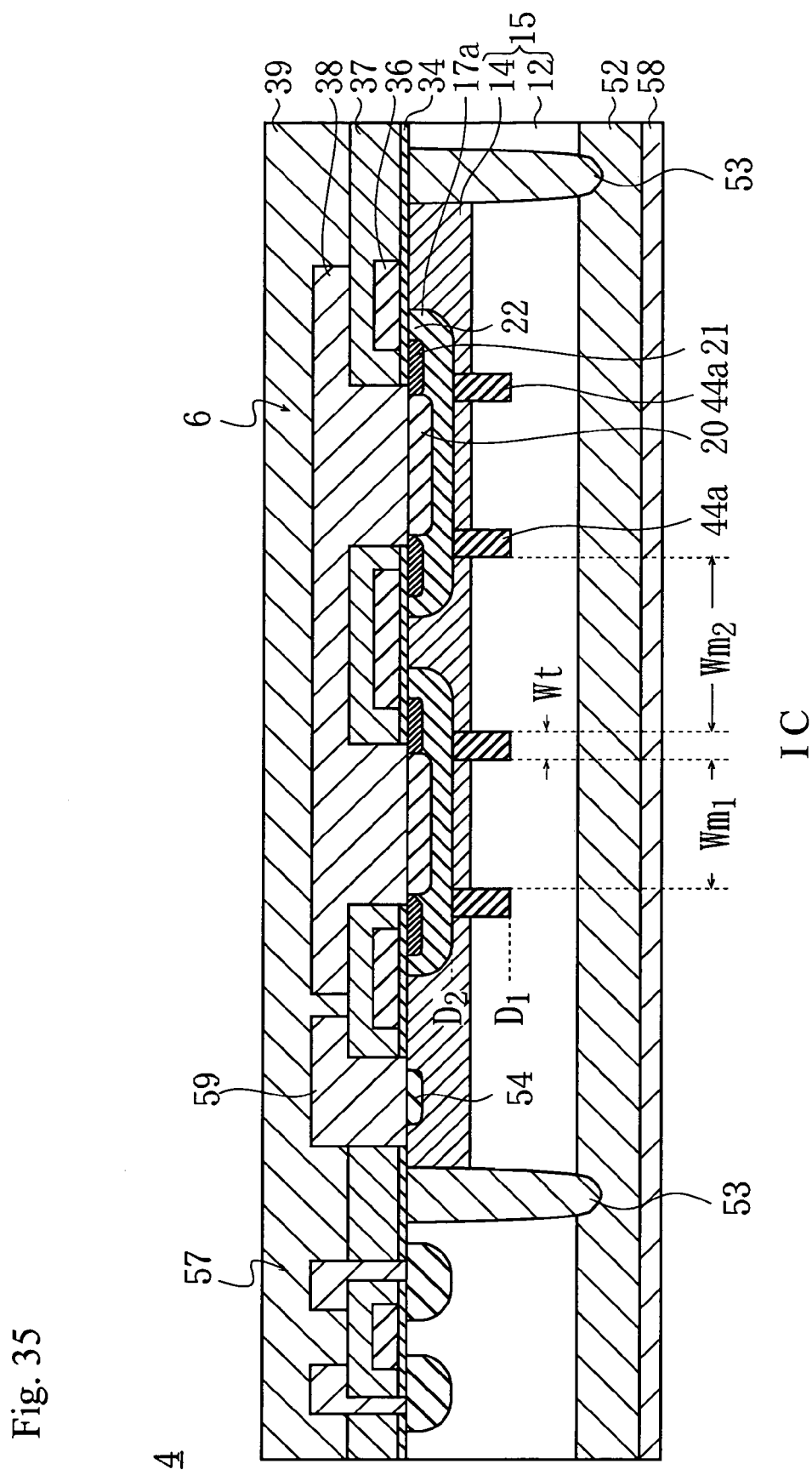
FIG. 35 is a sectional view for illustrating a semiconductor device according to a fourth embodiment of the invention.

The reference numeral 4 in FIG. 35 denotes the semiconductor device according to the fourth embodiment of the invention, and a growth layer 12 of the first conductivity type is epitaxially grown on a support substrate 52 of the second conductivity type.

The semiconductor device 4 has an isolation diffusion region 53 formed by diffusion from the surface of the resistance layer 15 and having its bottom reached to the support substrate 52.

The isolation diffusion region 53 has a ring shape and surrounds the active region in which the base diffusion region 17a is formed.

Inside the region surrounded by the isolation diffusion region 53, a conductive layer 14 is formed, and in the vicinity of the inner surface of the conductive layer 14, a drain diffusion region 54 of the first conductivity type simultaneously formed with the source diffusion region 21 is provided. A drain electrode film 59 formed simultaneously with the source electrode film 38 and electrically insulated from the source electrode film 38 is provided on the surface of the drain diffusion region 54, and these elements form a transistor 6.

On the outer side of the ring-shaped isolation diffusion region 53, semiconductor elements 57 (such as, a transistor and a diode for small signals) are formed, and a plurality of such semiconductor elements 57 form an electronic circuit (such as, a control circuit).

An earth electrode film 58 connected to a ground potential is formed on the surface of the support substrate 52. The gate electrode film 36 is connected to the semiconductor elements 57 on the outer side of the isolation diffusion region 53, and the transistor 6 is controlled by such a control circuit formed by the semiconductor elements 57.

When the earth electrode film 58 is at the ground potential, a voltage is applied between the drain electrode film 59 and the source electrode film 38, and a voltage equal to or higher than the threshold voltage is applied to the gate electrode film 36, an inversion layer is formed in the channel region 22 and conducts.

In the conduction state, current is passed laterally inside the resistance layer 15 between the source electrode film 38 and the drain electrode film 59.

When the gate electrode film 36 attains a voltage level less than the threshold voltage, a cutoff state is attained.

Both in the conduction state and in the cutoff state, the isolation diffusion region 53 and the resistance layer 15 are reverse biased, and the transistor 6 and the other semiconductor elements 57 are electrically isolated from one another.

It is noted that for the semiconductor device according to the invention, a single crystal of silicon may be used as a single crystal of a semiconductor. Alternatively, other kinds of single crystal semiconductor (such as, GaAs) may be employed.

In the above described embodiments, there is the plurality of base diffusion regions 17a isolated from one another, while the base diffusion regions 17a may be connected in a comb manner by a diffusion region of the second conductivity type.

The invention claimed is:

1. A semiconductor device comprising:
   a resistance layer of a first conductivity type;
   a plurality of base diffusion regions of a second conductivity type formed in the vicinity of inner surface of the resistance layer and positioned apart from one another;
   a source diffusion region of the first conductivity type formed in the vicinity of inner surface of each of the base diffusion regions, the source diffusion region being positioned in a region more on the inner side than the edge of each of the base diffusion regions, and the source diffusion region has a depth shallower than that of each of the base diffusion regions;
   a channel region positioned near the edge of each of the base diffusion regions and between the edges of each of the base diffusion regions and the edges of each of the source diffusion regions;
   a gate insulating film positioned at least on each of the channel regions;
   a gate electrode film positioned on the gate insulating film; and
   a plurality of buried regions of the second conductivity type provided plurally on the bottom of each of the base diffusion regions and connected to each of the base diffusion regions,
   wherein among pairs of adjacent base diffusion regions, between a center of width direction of one base diffusion region and the center of width direction of the other base diffusion region and in a range deeper than the depth of the base diffusion regions and shallower than the bottom of the buried regions, an amount of impurity of the first conductivity type and an amount of the impurity of the second conductivity type are substantially equal;
   a PN junction between the buried region and the resistance layer is set such that the avalanche breakdown does not occur at a voltage at which inside of the buried regions is filled with a depletion layer, and
   a width $Wm_1$ of the resistance layer in the part between the buried regions adjacent at the bottom of the same base diffusion region is larger than a width $Wm_2$ of the resistance layer in the part between the buried regions adjacent at the bottoms of the different base diffusion regions.

2. The semiconductor device according to claim 1, wherein:
   the base diffusion regions have a longitudinal direction, the longitudinal directions are provided parallel to one another, and
   the buried regions are provided parallel to one another along the longitudinal directions of the base diffusion regions.

3. The semiconductor device according to claim 1, wherein each of the buried regions includes an active groove formed in the resistance layer and a semiconductor material of the second conductivity type filled in the active groove.

4. The semiconductor device according to claim 2, wherein widths of the buried regions are equal to each other.

5. The semiconductor device according to claim 2, wherein lengths of the buried regions are equal.

6. The semiconductor device according to claim 1, comprising:
   a plurality of ring-shaped withstand voltage grooves surrounding the base diffusion region; and
   a semiconductor material of the second conductivity type arranged in the withstand voltage grooves.

7. The semiconductor device according to claim 1, further comprising a source electrode film electrically connected to the source diffusion region and the base diffusion region.

8. The semiconductor device according to claim 1, further comprising a drain layer of the same conductivity type as that of the resistance layer and having a higher concentration than that of the resistance layer arranged on a surface opposite to the surface of the resistance layer at which the base diffusion region is formed.

9. The semiconductor device according to claim 1, further comprising a collector layer of the conductivity type opposite to that of the resistance layer arranged on a surface opposite to the surface of the resistance layer at which the base diffusion region is formed.

10. The semiconductor device according to claim 1, further comprising a Schottky electrode film that forms a Schottky junction with the resistance layer arranged on a surface opposite to the surface of the resistance layer at which the base diffusion region is formed.

11. The semiconductor device according to claim 7, further comprising a drain electrode film at the surface of the resistance layer on a side having the base diffusion region, the drain electrode film being electrically connected to the resistance layer and insulated from the source electrode film.

* * * * *